US010770489B2

(12) United States Patent
Tsang et al.

(10) Patent No.: US 10,770,489 B2
(45) Date of Patent: Sep. 8, 2020

(54) OPTOELECTRONIC DEVICE ARRANGED AS A MULTI-SPECTRAL LIGHT SENSOR HAVING A PHOTODIODE ARRAY WITH ALIGNED LIGHT BLOCKING LAYERS AND N-WELL REGIONS

(71) Applicant: VISHAY INTERTECHNOLOGY, INC., Malvern, PA (US)

(72) Inventors: Koon-Wing Tsang, Fremont, CA (US); Yuh-Min Lin, San Ramon, CA (US)

(73) Assignee: VISHAY INTERTECHNOLOGY, INC., Malvern, PA (US)

( * ) Notice: Subject to any disclaimer, the term of this patent is extended or adjusted under 35 U.S.C. 154(b) by 0 days.

(21) Appl. No.: 15/941,855

(22) Filed: Mar. 30, 2018

(65) Prior Publication Data

US 2019/0305016 A1 Oct. 3, 2019

(51) Int. Cl.

| | |
|---|---|
| ***H01L 27/144*** | (2006.01) |
| ***H01L 31/0216*** | (2014.01) |
| ***G01J 3/02*** | (2006.01) |
| ***G01J 3/28*** | (2006.01) |

(52) U.S. Cl.

CPC ........ *H01L 27/1446* (2013.01); *G01J 3/0229* (2013.01); *G01J 3/2803* (2013.01); *H01L 31/02164* (2013.01); *H01L 31/02165* (2013.01); *G01J 2003/2806* (2013.01)

(58) Field of Classification Search

CPC ........... H01L 27/1446; H01L 31/02019; H01L 31/18; H01L 31/02164; H01L 31/02165; H01L 27/14621; H01L 27/4623; H01L 27/1463; G01J 3/0229; G01J 3/2803; G01J 2003/2806; G02B 5/201

See application file for complete search history.

(56) References Cited

U.S. PATENT DOCUMENTS

| | | | | |
|---|---|---|---|---|
| 7,521,666 B2 | 4/2009 | Tsang | | |
| 2012/0118318 A1 | 5/2012 | Poulsen et al. | | |
| 2012/0188397 A1* | 7/2012 | Ohta | H01L 27/1464 | 348/222.1 |
| 2012/0248560 A1* | 10/2012 | Lee | H01L 27/14627 | 257/432 |

(Continued)

OTHER PUBLICATIONS

International Search Report dated Jun. 14, 2019, corresponding application PCT/US2019/024761.

*Primary Examiner* — Michael P LaPage

(74) *Attorney, Agent, or Firm* — Volpe and Koenig, P.C.

(57) ABSTRACT

An optoelectronic device is disclosed, comprising: a photodiode array including a plurality of first photodiodes, each first photodiode including a respective n+ region and a respective n-well region; a guide array disposed over the photodiode array, the guide array including a plurality of guide members separated from one another by a layer of light-blocking material, the guide members being aligned with the n+ regions of the first photodiodes, such that each guide member is disposed over a different respective n+ region, and the layer of light-blocking material being aligned with the n-well regions of the first photodiodes; and a filter array disposed over the guide array, the filter array including a plurality of bandpass filters, each bandpass filter being aligned with a different one of the plurality of guide members, each bandpass filter having a different transmission band.

16 Claims, 20 Drawing Sheets

(56) References Cited

U.S. PATENT DOCUMENTS

| | | | | |
|---|---|---|---|---|
| 2013/0020620 | A1 | 1/2013 | Wober | |
| 2014/0291793 | A1* | 10/2014 | Tanaka | H01L 27/14623 257/435 |
| 2016/0043119 | A1* | 2/2016 | Lee | H01L 27/1463 250/208.1 |
| 2016/0111461 | A1* | 4/2016 | Ahn | H01L 27/14614 250/208.1 |
| 2017/0115436 | A1 | 4/2017 | Qian et al. | |
| 2018/0295295 | A1* | 10/2018 | Hicks | H01L 27/14689 |

* cited by examiner

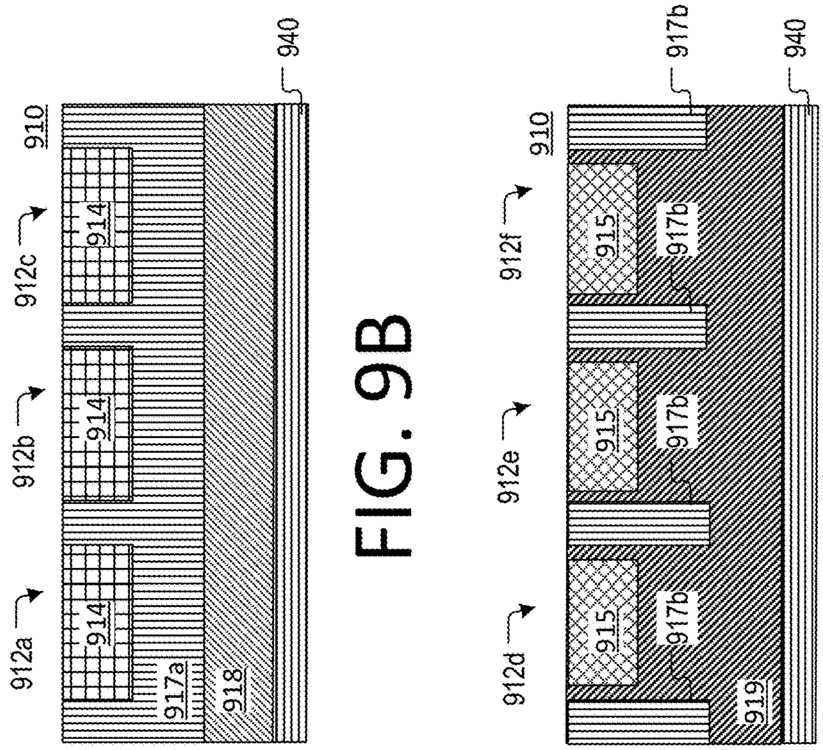
FIG. 9B
FIG. 9C
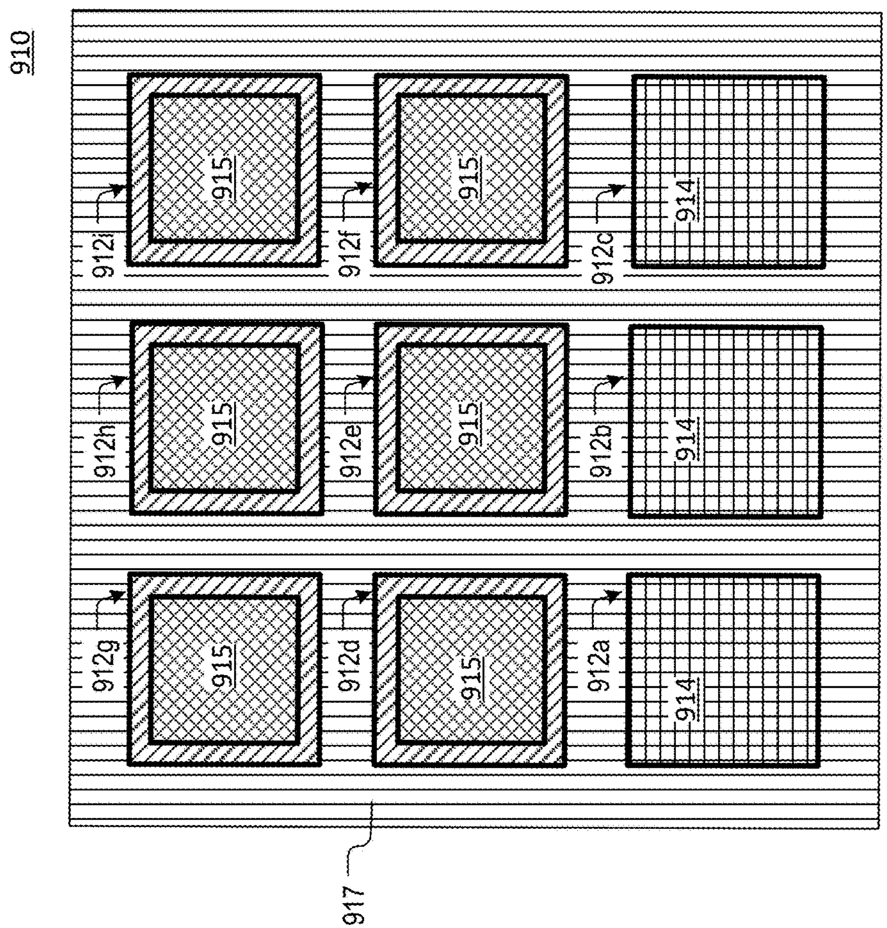
FIG. 9A

OPTOELECTRONIC DEVICE ARRANGED AS A MULTI-SPECTRAL LIGHT SENSOR HAVING A PHOTODIODE ARRAY WITH ALIGNED LIGHT BLOCKING LAYERS AND N-WELL REGIONS

FIELD

The present disclosure relates to light sensing devices in general, and more particularly, to a multi-spectral light sensor.

BACKGROUND

Measuring color is an important part of assessing the operation of various electronic devices, such as printing devices and display devices. Furthermore, measuring color is an important part of assessing the performance of various light sources, such as light emitting diodes (LEDs), fluorescent lights, halogen lights, infra-red (IR) light sources, and ultra-violet (UV) light sources. Color meters that are commonly used in the field can have a high cost. Their cost can start in the hundreds of dollars and reach to the thousands, and it can be prohibitively high in some circumstances. Accordingly, the need exists for new color meter designs that can be manufactured more efficiently and have a reduced cost.

SUMMARY

The present disclosure addresses this need. According to aspects of the disclosure, an optoelectronic device is provided comprising: a photodiode array including a plurality of first photodiodes, each first photodiode including a respective n+ region and a respective n-well region; a guide array disposed over the photodiode array, the guide array including a plurality of guide members separated from one another by a layer of light-blocking material, the guide members being aligned with the n+ regions of the first photodiodes, such that each guide member is disposed over a different respective n+ region, and the layer of light-blocking material being aligned with the n-well regions of the first photodiodes; and a filter array disposed over the guide array, the filter array including a plurality of bandpass filters, each bandpass filter being aligned with a different one of the plurality of guide members, each bandpass filter having a different transmission band.

According to aspects of the disclosure, an optoelectronic device is provided comprising: a photodiode array including a plurality of first photodiodes; a guide array disposed over the photodiode array, the guide array including a plurality of guide members separated from one another by a layer of light-blocking material, each guide member being aligned with a different one of the plurality of first photodiodes; and a filter array disposed over the guide array, the filter array including a plurality of bandpass filters, each bandpass filter being aligned with a different one of the plurality of guide members, and each bandpass filter having a different respective transmission band.

According to aspects of the disclosure, a method for manufacturing an optoelectronic device is provided, comprising: forming a first layer of light-transmissive material over a photodiode array, the photodiode array including a plurality of photodiodes, each photodiode having a respective n-well region forming a plurality of first trenches in the first layer of light-transmissive material; forming a layer of light-blocking material in the plurality of first trenches; forming a first metal layer over the first layer of light-transmissive material and the layer of light-blocking material; forming a second layer of light-transmissive material over the first metal layer; forming a plurality of second trenches in the second layer of light-transmissive material, each of the second trenches having a different depth; forming a respective second metal layer in each of the plurality of second trenches; and filling each of the second trenches with a light-transmissive material after the second trench's respective second metal layer is formed in the second trench.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

FIG. 9A is a top-down view of an example of a photodiode array that is formed as a result of executing a first step in the process of FIG. 8;

FIG. 9B is a first cross-sectional side view of the photodiode array of FIG. 9A. according to aspects of the disclosure;

FIG. 9C is a second cross-sectional side view of the photodiode array of FIG. 9A. according to aspects of the disclosure;

DETAILED DESCRIPTION

Figure 1A:
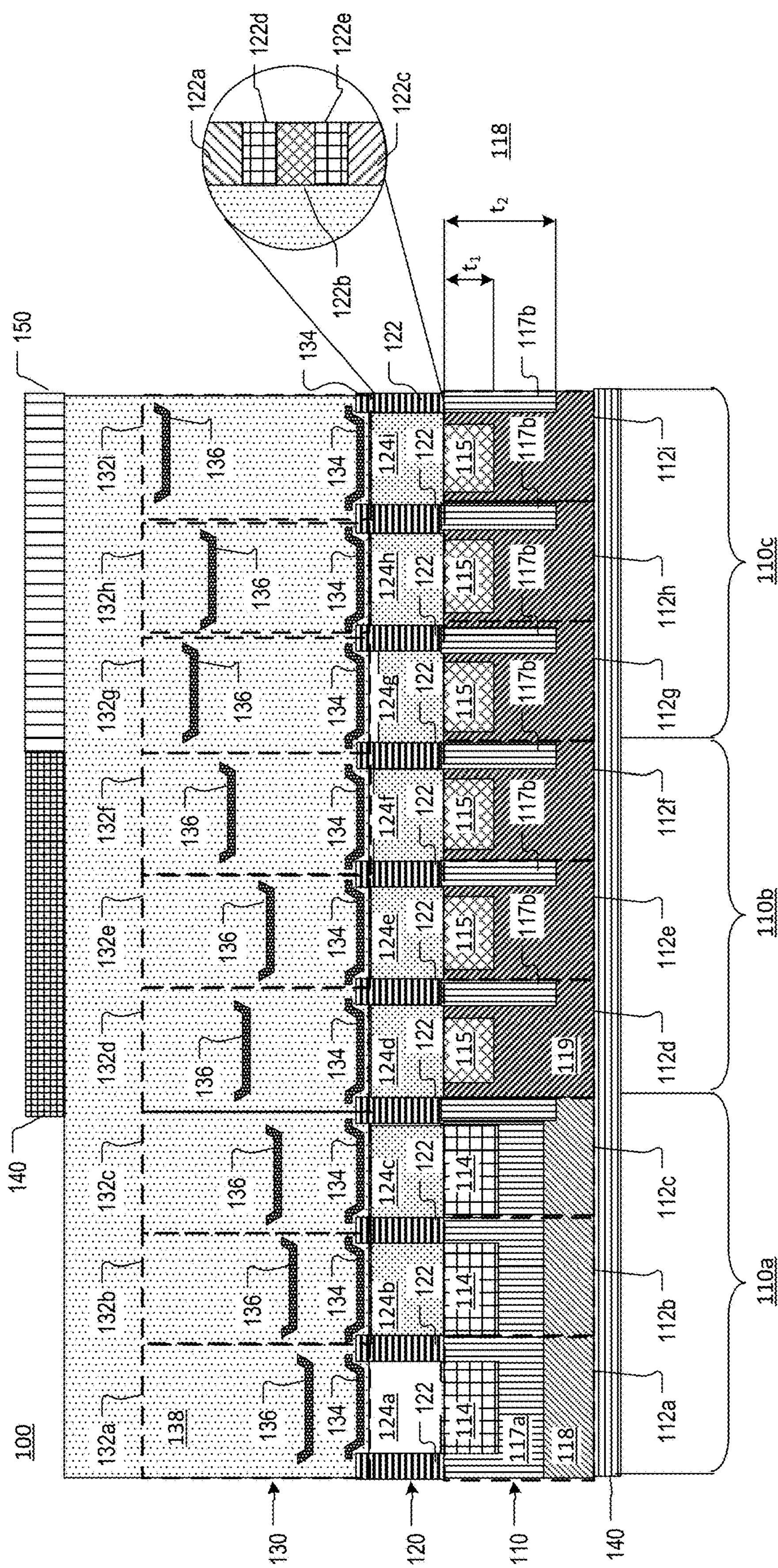
FIG. 1A is cross-sectional side view of an example a detector array that includes an IR-pass and IR-cutoff filters, according to aspects of the disclosure.

According to aspects of the disclosure, a detector array is provided for measuring characteristics of light. The detector array may include a photodiode array and a filter array disposed over the photodiode array. The photodiode array may include a plurality of photodiodes. The filter array may include a plurality of bandpass filters. Each bandpass filter may be positioned over a different photodiode. Furthermore, each bandpass filter may have a different transmission band than the rest, thereby enabling its underlying photodiode to measure the energy of the light in the filter's transmission band. When the signals produced by the photodiodes in the detector array are combined, an energy measurement can be obtained for an entire spectrum of interest. The spectrum of interest may encompass one or more of the visible light band, the IR band, and/or the UV band.

According to aspects of the disclosure, the optoelectronic device is provided that includes the detector array and a signal processor that is configured to process the signals generated by the photodiodes in the detector array. In some implementations, the signal processor may include an input/output interface that is configured to serially output the signals by the photodiodes in the photodiode array. Additionally or alternatively, in some implementations, the signal processor may include a processor that is configured to perform one or more arithmetic and logic operations based on the signals generated by the photodiodes in the photodiode array, and output the result of the operations via the I/O interface. For example, the processor may be configured to calculate the color of light that is incident upon the optoelectronic device, and output an indication of the color via the I/O interface.

According to aspects of the disclosure, the detector array may include various adaptations for reducing cross-talk between photodiodes in the photodiode array. In some implementations, the detector array may include a guide array that is disposed between the photodiode array and the filter array. The guide array may include a plurality of guide members. Each guide member may be formed of a light-transmissive material. Each guide member may be disposed between a different photodiode/filter pair, such that light that is filtered through the filter in the pair is guided by the guide member to the photodiode in the same pair.

According to aspects of the disclosure, the guide members in the guide array may be separated from one another by a layer of light-blocking material. The layer of light-blocking material may be formed in the spaces between the guide members in the guide array, thereby reducing the amount of light that can travel between neighboring guide members. The layer of light-blocking material may be formed of at least one of a light reflecting material and a light absorbing material. In some implementations, the layer of light-blocking material may include three metal layers that are stacked over each other.

According to aspects of the disclosure, the photodiode array may be configured to reduce cross-talk between the photodiodes in the photodiode array. For example, in some instances, the photodiodes may be CMOS photodiodes including respective n+/p-epi regions and one or more n-well region(s). The n-well region(s) may be diffused/implanted to a depth that is greater than the depth at which photons having a predetermined wavelength can penetrate the photodiode array. The predetermined wavelength may include any suitable wavelength, such as a wavelength that is in the ultraviolet (UV) band, a wavelength that is in the IR band, and a wavelength that is in the visible light band. Because the n-well is biased to a bandgap generated DC voltage, the n-well regions may reduce the amount of light from traveling between neighboring p+/n+ regions, thereby reducing the amount of cross-talk between the photodiodes in the photodiode array.

According to aspects of the disclosure, the light-blocking layer of the guide array may be at least partially aligned with the n-well region(s) of the photodiodes in the photodiode array. For example, the light-blocking layer of the guide array may be disposed directly over the n-well regions to create a continuous structure which prevents light from traveling sideways. This structure may reduce the amount of cross-talk that occurs between the photodiodes in the photodiode array by ensuring that all (or a significant portion of) light that enters the optoelectronic device through a given filter reaches only (or primarily) a given photodiode that is situated under the given filter, without affecting photodiodes that are situated adjacently to the given photodiode. In some aspects, aligning the light-blocking layer of the guide array with the n-well region(s) of the photodiode array can significantly improve the accuracy of the resultant detector array.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIG. 1A is a diagram of an example of a detector array 100, according to aspects of the disclosure. The detector array 100 may include a section 110*a* that is configured to detect the spectral characteristics of UV light, a section 110*b* that is configured to detect the spectral characteristics of visible light, and a section 110*c* that is configured to detect the spectral characteristics of IR light. More particularly, the detector array 100 may include a photodiode array 110, a guide array 120 disposed over the photodiode array, and a filter array 130 disposed over the guide array 120. Furthermore, the detector array 100 may include and an IR cutoff filter 140 and IR pass filter 150 disposed over the filter array 130, as shown.

The photodiode array 110 may include a plurality of photodiodes 112*a-i* that are formed over a p-substrate 140. The photodiodes 112*a-c* may be P+/n-well photodiodes and they may be used to detect the power of light emissions in the UV band. Each of the photodiodes 112*a-c* may include a respective p+ region 114 that is surrounded on the sides and bottom by an n-well region 117*a*, and a p-region 118 that is disposed under the n-well region 117*a*. The photodiodes 112*d-i* may include n+/P− photodiodes and they may be used to detect the power of light emissions in the IR and visible light bands. Each of the photodiodes 112*d-i* may include a respective n+ region 115 that is surrounded on the sides, but not necessarily the bottom, by an n-well region 117*b*, and a p-region 119 disposed under the n-well region 117*b* and the n+ regions 115. In the present example, the n-well regions 117*a* and 117*b* have the same composition, but alternative implementations are possible in which the n-well regions 117*a-b* have different compositions. For ease of description, throughout this disclosure, the n-well regions 117*a* and 117*b* may be referred to collectively, as n-well region 117, when appropriate. Similarly, the respective n-well regions 117*b* of the photodiodes 112*d-i* may be referred to collectively as "a n-well region" and they might be part of a continuous n-well layer, as shown further below in FIGS. 9A-B.

In some implementations, the n-well regions 117*b* may have a secondary function of providing optical insulation between neighboring n+ regions 115 to prevent cross-talk between the photodiodes 112*d-i*. More particularly, in some implementations, the n+ regions 115 may have a thickness $t_1$ and the n-well a regions 117*b* may have a thickness $t_2$ that is greater than the thickness $t_2$. The thickness $t_2$ may be greater than the depth at which one or more photons having a predetermined frequency can penetrate the photodiode array 110. By way of example, the predetermined frequency may be a frequency in the UV band, a frequency in the IR band, or a frequency in the visible light band.

The guide array 120 may include a plurality of guide members 124*a-i* separated by a light-blocking layer 122. Each of the guide members 124*a-i* may be aligned with a different one of the photodiodes 112*a-i*, as shown. Furthermore, each of the guide members 124*a-i* may be formed of a dielectric light-transmissive material. The light-transmissive material may include a SiN or SiO2 material and/or any other suitable type of light-transmissive material. The light-blocking layer 122 may be formed of at least one of a light reflecting material and/or a light absorbing material. In some implementations, the light-blocking layer 122 may be arranged to prevent (or reduce) cross-talk between the guide members 124*a-i* by preventing light from travelling from one of the guide members 124*a-i* to another. In some implementations, the light-blocking layer 122 may be formed of three metal layers 122*a-c* that are stacked over one another, as shown, and separated by layers 122*d-e*. In some implementations, any of the metal layers 122*a-c* may be formed of the same material as the rest. Additionally or alternatively, in some implementations, any of the metal layers 122*a-c* may be formed of a different material than the rest. In some implementations, the metal layer 122*a* may be formed of aluminum or aluminum-silicon alloy such as Al—Si—Cu, the metal layer 122*b* may be formed of Al—Cu alloy sandwiched between titanium nitride barrier layer, and the metal layer 122*c* may be formed of copper. The layers 122*d-e* may be formed of the same material or different materials. In some implementations, the layer 122*d* may be formed of tungsten plugs with TiN adhesion layer and the layer 122*e* may be formed of copper. In some implementations, the light-blocking layer 122 may be formed concurrently (and/or simultaneously) with the metallization of CMOS logic that is situated on the same die as the detector array 100 (e.g., see the signal processor 405 in FIG. 4). In such instances, the structural composition of the light-blocking layer stack (e.g., the light blocking layer 122) may be mainly determined by the implementation of the CMOS or BiCMOS back end of line (BEOL) technologies used. By way of example, the technologies used may include a 3 metal layer or 4 metal layer BEOL technologies. Although in the present example, the light-blocking layer 122 has a multi-layer structure, alternative implementations are possible in which the light-blocking layer 122 includes only one layer.

In some implementations, each of the guide members 124*a-i* may have a thickness in the range of 4.5 um to 5.5 um. Additionally or alternatively, in some implementations, the light-blocking layer 122 may have a thickness in the range of 6.5 um to 7.7 um. Additionally or alternatively, in some implementations, the light-blocking layer 122 may have a greater thickness than any of the guide members 124*a-i*. For example, in such instances, the guide members 124*a-i* may have a thickness in the range of 4.5 um to 5.5 um and the light-blocking layer 122 may have a thickness in the range of 6.5 um to 7.7 um. Additionally or alternatively, in some implementations, the guide array 120 may have a thickness in the range of 7.5 um to 8.5 um.

Figure 2:
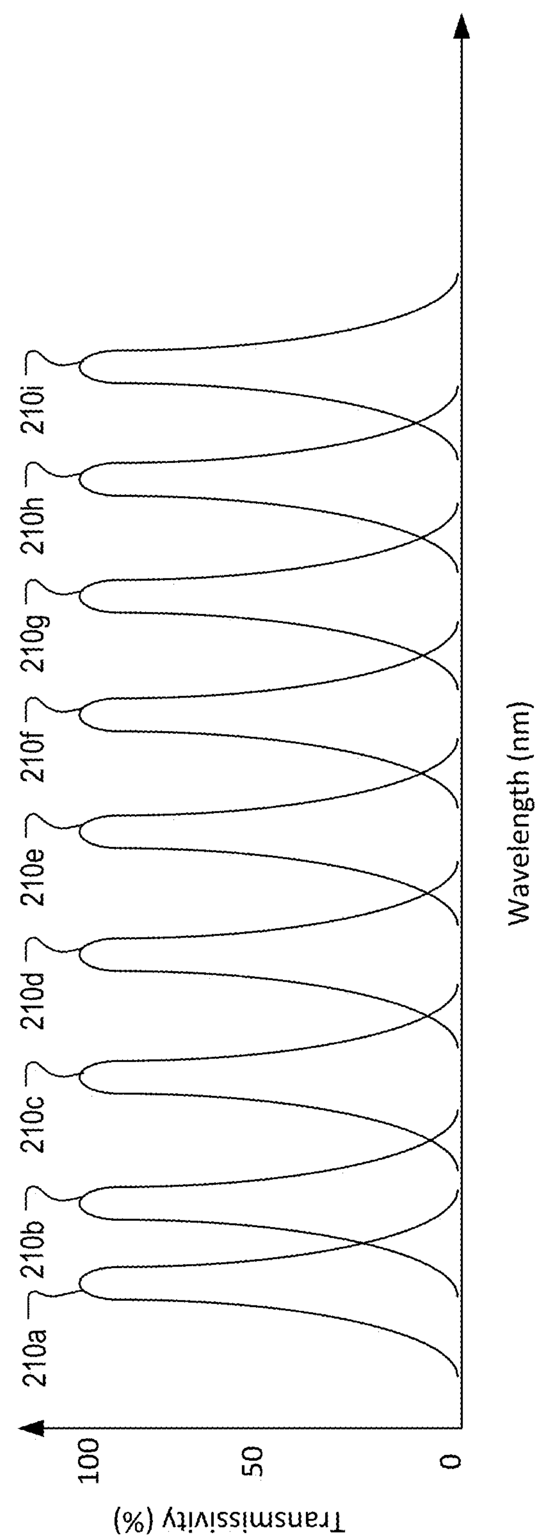
FIG. 2 is a plot illustrating the transmission bands of a plurality of bandpass filters that are part of the detector array of FIG. 1A.

The filter array 130 may include a plurality of bandpass filters 132*a-i*. Each of the filters 132*a-i* may be aligned with a different one of the guide members 124*a-i*. Furthermore, each bandpass filter may have a different transmission band. As illustrated in FIG. 2, the filter 132*a* may have a transmission band 210*a* (e.g., 300-330 nm); the filter 132*b* may have a transmission band 210*b* (e.g., 340-370 nm); the filter 132*c* may have a transmission band 210*c* (e.g., 370-400 nm); the filter 132*d* may have a transmission band 210*d* (e.g., 400-500 nm); the filter 132*e* may have a transmission band 210*e* (e.g., 500-600 nm); the filter 132*f* may have a transmission band 210*f* (e.g., 600-700 nm); the filter 132*g* may have a transmission band 210*g* (e.g., 700-800 nm); the filter 132*h* may have a transmission band 210*h* (e.g., 800-900 nm); and the filter 132*i* may have a transmission band 210*i* (e.g., 900-1000 nm).

The filter array 130 may include a plurality of metal layers 134 and a plurality of metal layers 136. Each of the metal layers 134 may be aligned with a different one of the metal layers 136. Additionally or alternatively, each of the metal layers 134 may be spaced apart by a different distance from the metal layer 136 with which the metal layer 134 is aligned. In some implementations, a metal layer 136 may be considered to be aligned with a given metal layer 134 if at least some of light passing through the metal layer 136 reaches the given metal layer 134. Additionally or alternatively, in some implementations, a metal layer 136 may be considered to be aligned with a given metal layer 134, if at least a portion of the metal layer 136 is situated directly above the given metal layer 134.

In some implementations, the metal layers 134 and 136 may be suspended in a layer of light-transmissive material 138, as shown. The metal layers 134 and 136 may be formed of any suitable type of material. In some implementations, any of the metal layers 134 and 136 may be formed of an alloy including aluminum and silver. The layer of light-transmissive material may include a SiN material and/or any other suitable type of light-transmissive material like silicon dioxide SiO2. In some implementations, each of the metal layers 134 may have a thickness in the range of 400 A to 600 A. Additionally or alternatively, in some implementations, each of the metal layers 136 may have a thickness in the range of 400 A to 600 A. Additionally or alternatively, in some implementations, the entire filter array 130 may have a thickness in the range of 0.125 um to 0.4 um.

Each of the filters 132*a-i* in the filter array 130 may include a respective one of the respective metal layer 136 and a different one of the metal layers 134 that is situated underneath the metal layer 136. In some implementations, as noted above, the distance between the metal layers 134 and 136 in any of the filters 132*a-i* may be different from the distance between the metal layers 134 and 136 in the remaining ones of the filters 132*a-i*. More precisely, each of the filters 132*a-i* may include a different Fabry-Perot cavity that is formed by the filter's respective metal layer 136 and the metal layer 134. Although in the present example the filters 132*a-i* are implemented using Fabry-Perot cavities, alternative implementations are possible in which another type of filter is used such as double stack of Fabry-Perot cavity having three metal layers and two layer of light-transmissive materials forming a stack including Ag/SIN/Ag/SIN/Ag layers.

Figure 1B:
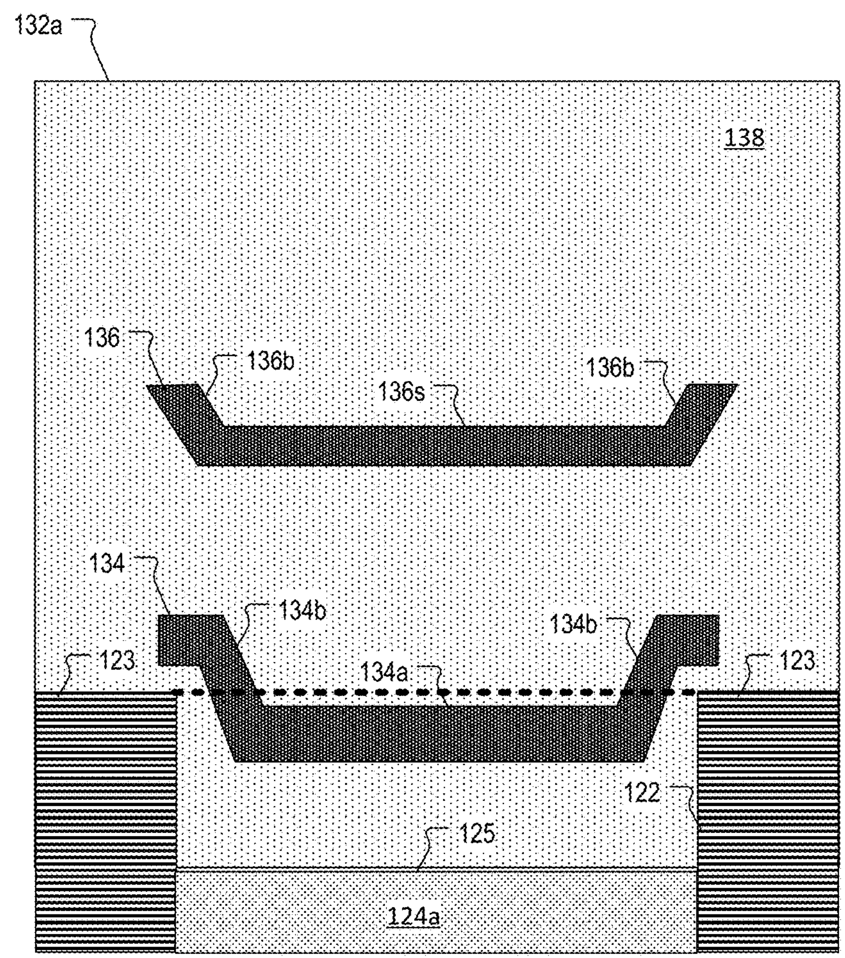
FIG. 1B is cross-sectional side view of an example a of a bandpass filter that is part of the detector array of FIG. 1, according to aspects of the disclosure.

FIG. 1B shows the configuration of the filter 132*a* in further detail, in accordance with one particular implementation. In some implementations, apart from the distance between the metal layers 134 and 136, the structure of the filters 132*b-i* may be the same or similar to that of the filter 132*a*. As is further discussed below, FIG. 1B is provided to clearly show the spatial relationship between each (or at least one) of the metal layers 134 and the light-blocking layer 122. Shown in FIG. 1B is a portion of the guide member 124*a* and a portion of the light-blocking layer 122. As illustrated in FIG. 1B, the light-blocking layer 122 may have a thickness that is greater than the thickness of the guide member 124*a*, such that a top surface 123 of the light-blocking layer 122 is situated above the top surface 125 of the guide member 124*a*. As illustrated, the metal layer 136 may include a central portion 136*a* and end portions 136*b* that are inclined relative to the central portion 136*a*. Similarly, the metal layer 134 may include a central portion 134*a* and end portions 134*b* that are inclined relative to the central portion 134*a*. In some implementations, the entire central portion 134*a* of the metal layer 134 may be situated below the level of the top surface 123 of the light-blocking layer 122. Additionally or alternatively, in some implementations, only some of the central portion 134*a* of the metal layer 134 may be situated below the level of the top surface 123 of the light-blocking layer. Situating at least some of the central portion 134*a* of the metal layer 134 below the level of the top surface 123 of the light-blocking layer 132 may reduce the amount of cross-talk between the filter 132*a* and neighboring filters to greatly improve the resolution of the filter array 130. In the example of FIG. 1B, the level of the top surface 123 is denoted by a dashed line.

Figure 15A:
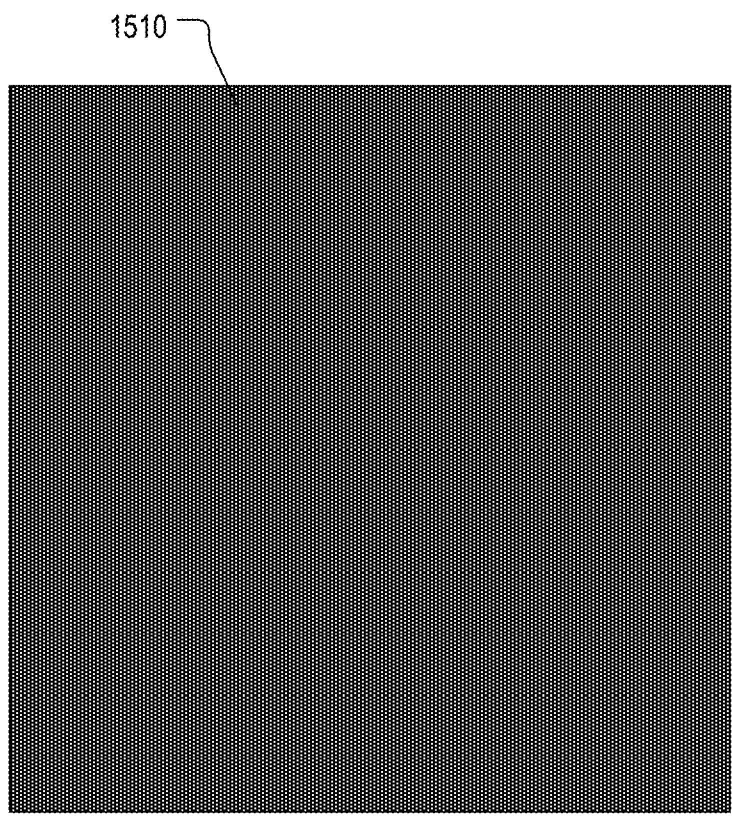
FIG. 15A is a top-down view of an assembly that includes a first metal layer formed over the assembly of FIG. 14A as a result of executing a seventh step in the process of FIG. 8, according to aspects of the disclosure.
Figure 15B:
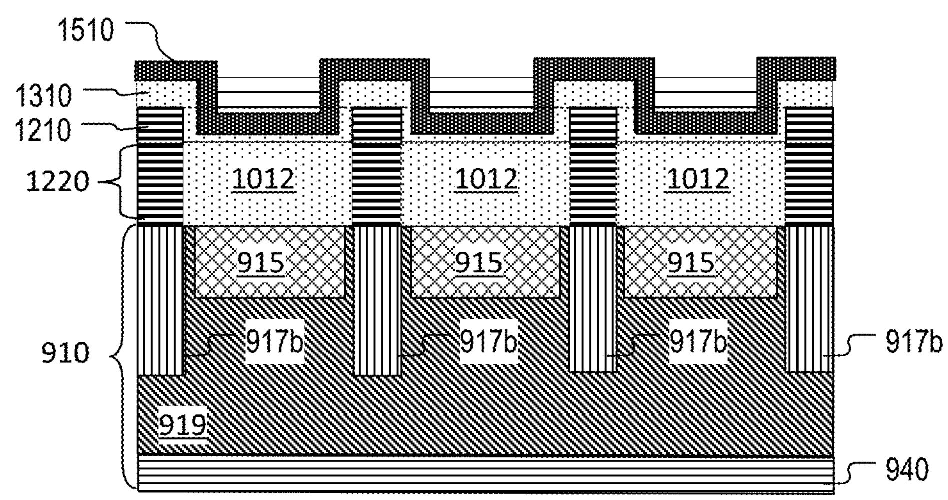
FIG. 15B is a cross-sectional side view of the assembly of FIG. 15A, according to aspects of the disclosure.

Although in the present example, the metal layer 134 includes a horizontal central portion 134*a* and inclined end-portions 134*b*, alternative implementations are possible in which the inclined end-portions 134*b* are omitted. Although in the present example, the metal layer 136 includes a horizontal central portion 136*a* and inclined end-portions 136*b*, alternative implementations are possible in which the inclined end-portions 136*b* are omitted. In the present example, the metal layer 134 can be regarded as different segments (or portions) of the same discontinuous metal layer. In this regard, it will be understood that alternative implementations are possible in which the metal layers 134 are replaced by a single continuous metal layer (e.g., see the metal layer 1510 which is shown in FIGS. 15A-B). Moreover, in the present example, the metal layers 136 can be regarded as different segments (or portions) of the same discontinuous metal layer. In this regard, it will be understood that alternative implementations are possible in which the metal layers 136 are replaced by a single continuous metal layer (e.g., see the metal layer 1810 which are shown in FIGS. 15A-B).

Returning to FIG. 1A, the IR-cutoff filter 140 may be disposed over the filters 132*d-f*. In some implementations, the IR-cutoff filter 140 may be arranged to block light having a wavelength that is greater than 700 nm and transmit light having a wavelength that is less than 700 nm. Additionally or alternatively, in some implementations, the IR-cutoff filter 140 may have a thickness in the range of 4 um to 5 um. The IR-pass filter 150 may be disposed over the filters 132*g-i*. In some implementations, the IR-pass filter may be arranged to block light having a wavelength that is less than 700 nm and transmit light having a wavelength that is greater than 700 nm. Additionally or alternatively, in some implementations, the IR-pass filter 150 may have a thickness in the range of 2 um to 2.5 um. Any of the IR-cutoff filter 140 and the IR-pass filter 150 may be an absorption filter based on organic dye or pigment. Any of the IR-cutoff filter 140 and the IR-pass filter 150 may be may be formed on top of the filter array 130 by using spin coating and/or any other suitable process. Additionally or alternatively, in some implementations, the IR-cutoff cutoff filter 150 can be a metallic interference IR-cutoff filter including silver and a dielectric material, such as $Nb_2O_5$ (niobium pentoxide), with a total thickness of lum. In some implementations, the Ag thickness may be about 100 A and the $Nb_2O_5$ thickness may be in the range of 500 A to 600 A. In some implementation, the IR-cutoff filter 140 and the IR-pass filter 150 may be replaced with a full dielectric IR-cutoff filter that is configured to block wavelengths lower than 400 nm and wavelengths larger than 700 nm. The total thickness of such full dielectric IR-cutoff filter may be in the range of 4.5 um to 5.5 um.

Figure 1C:
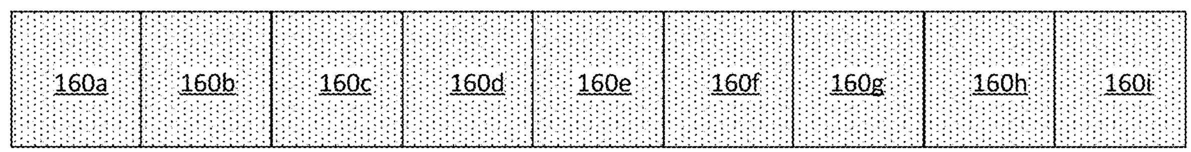
FIG. 1C is a top-down view of the detector array of FIG. 1A with the IR-pass and IR-cutoff filters removed, according to aspects of the disclosure.

FIG. 1C is a top-down view of the detector array 100 with the IR-cutoff filter 140 and the IR-pass filter 150 removed. FIG. 1C illustrates that the photodiodes 112*a-i*, the guide members 124*a-i*, and the filters 132*a-i* may be aligned to form a plurality of detector cells 160*a-i*. For example, the filter 132*a* may be aligned with the guide member 124*a*, and the guide member 124*a* may be aligned with the photodiode 112*a*. As a result, the filter 132*a*, the guide member 124*a*, and the photodiode 112*a* may together form the detector cell 160*a*. As another example, the filter 132*b* may be aligned with the guide member 124*b*, and the guide member 124*b* may be aligned with the photodiode 112*b*. As a result, the filter 132*b*, the guide member 124*b*, and the photodiode 112*b* may together form the detector cell 160*b*. As yet another example, the filter 132*i* may be aligned with the guide member 124*i*, and the guide member 124*i* may be aligned with the photodiode 112*i*. As a result, the filter 132*i*, the guide member 124*i*, and the photodiode 112*i* may together form the detector cell 160*i*.

In some implementations, a guide member may be considered to be aligned with an underlying photodiode if at least some of light passing through the guide member can reach the photodiode. Additionally or alternatively, in some implementations, a guide member may be considered to be aligned with an underlying photodiode if the guide member is disposed directly above the photodiode. Additionally or alternatively, in some implementations, a guide member may be considered to be aligned with an underlying photodiode if the guide member is disposed partially above the photodiode, such that a portion of the guide member is situated directly above the photodiode and another portion is overhanging the photodiode.

In some implementations, a filter may be considered to be aligned with an underlying guide member if at least some of light passing through the filter can reach the guide member. Additionally or alternatively, in some implementations, a filter may be considered to be aligned with an underlying guide member if the filter is disposed directly above the guide member. Additionally or alternatively, in some implementations, a filter may be considered to be aligned with an underlying guide member if the filter is disposed partially above the guide member, such that a portion of the filter is situated directly above the guide member and another portion is overhanging the guide member.

According to aspects of the disclosure, the detector cells 160*a-i* may be optically insulated from one another to eliminate (or reduce) the amount of crosstalk between the cells 160*a-i*, or the photodiodes 112*a-i*, in particular. In some implementations, the optical insulation may be provided by the light-blocking layer 122 which, as noted above, may prevent (or reduce the amount of) light travelling from one of the guide member 124*a-i* to another one of the guide member 124*a-i*. Additionally or alternatively, in some implementations, the optical insulation may be provided by the n-well region(s) 117 which, as noted above, may be arranged to prevent light that has reached one photodiode from travelling across that photodiode to reach neighboring photodiodes.

In some implementations, the light-blocking layer 122 may be aligned with the guide layer(s) 124*a-i* to form a continuous structure that prevents (or reduces the amount of) light that can travel from one of the detector cells 160*a-i* to another one of the detector cells 160*a-i*. For example, at least a portion of the light-blocking layer 122 may be situated directly above the n-well region(s) 117*a* and/or the n-well region(s) 117*b*. In some implementations, aligning the light-blocking layer of the guide array with the n-well region(s) of the photodiode array may improve the accuracy of the detector array 100.

Figure 3A:
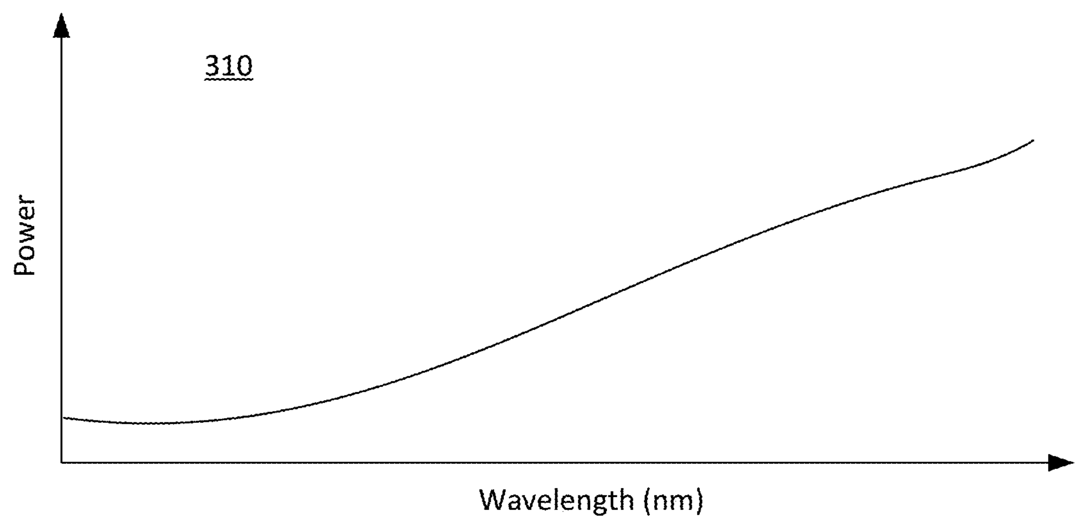
FIG. 3A is a plot illustrating the spectral content of a test light, according to aspects of the disclosure.
Figure 3B:
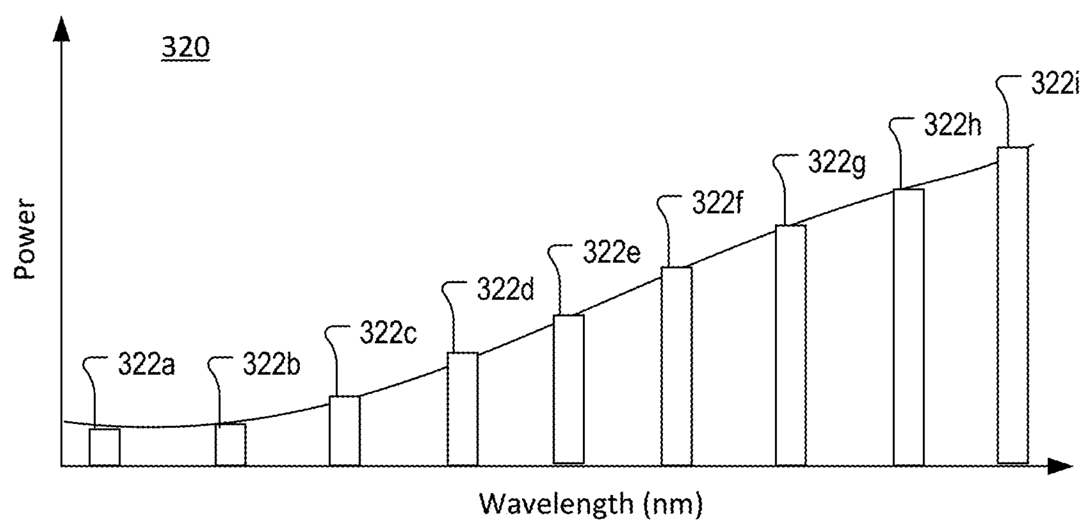
FIG. 3B is a plot illustrating the response of the detector array of FIG. 1A to the test light of FIG. 3A, according to aspects of the disclosure.

FIGS. 3A-B illustrate the operation of the detector array 100, according to aspects of the disclosure. Shown in FIG. 3A is a plot 310, which illustrates the spectral content of a test light. Shown in FIG. 3B is a plot 320, which illustrates the response of the detector array 100 to the test light. FIGS. 3A-B illustrate that when the detector array 100 is exposed to the test light, the signals generated by the photodiodes 112*a-i* in the detector array 100 may be used to reconstitute the spectral content of the test light over a given range of interest.

In the plot 320, the magnitude of each signal that is generated by the photodiodes 112*a-i* may be represented by a different one of the bars 322*a-i*. More particularly, the bar 322*a* may represent the magnitude of a signal (e.g., a voltage signal) generated by the photodiode 112*a*; the bar 322*b* may represent the magnitude of a signal generated by the photodiode 112*b*; and the bar 322*c* may represent the magnitude of a signal that is generated by the photodiode 112*c*. Similarly, the bar 322*d* may represent the magnitude of a signal generated by the photodiode 112*d*; the bar 322*e* may represent the magnitude of the signal generated by the photodiode 112*e*; the bar 322*f* may represent the magnitude of the signal generated by the photodiode 112*f*; the bar 322*g* may represent the magnitude of the signal generated by the photodiode 112*g*; the bar 322*h* may represent the magnitude of the signal generated by the photodiode 112*h*; and the bar 322*i* may represent the magnitude of the signal generated by the photodiode 112*i*.

Figure 4:
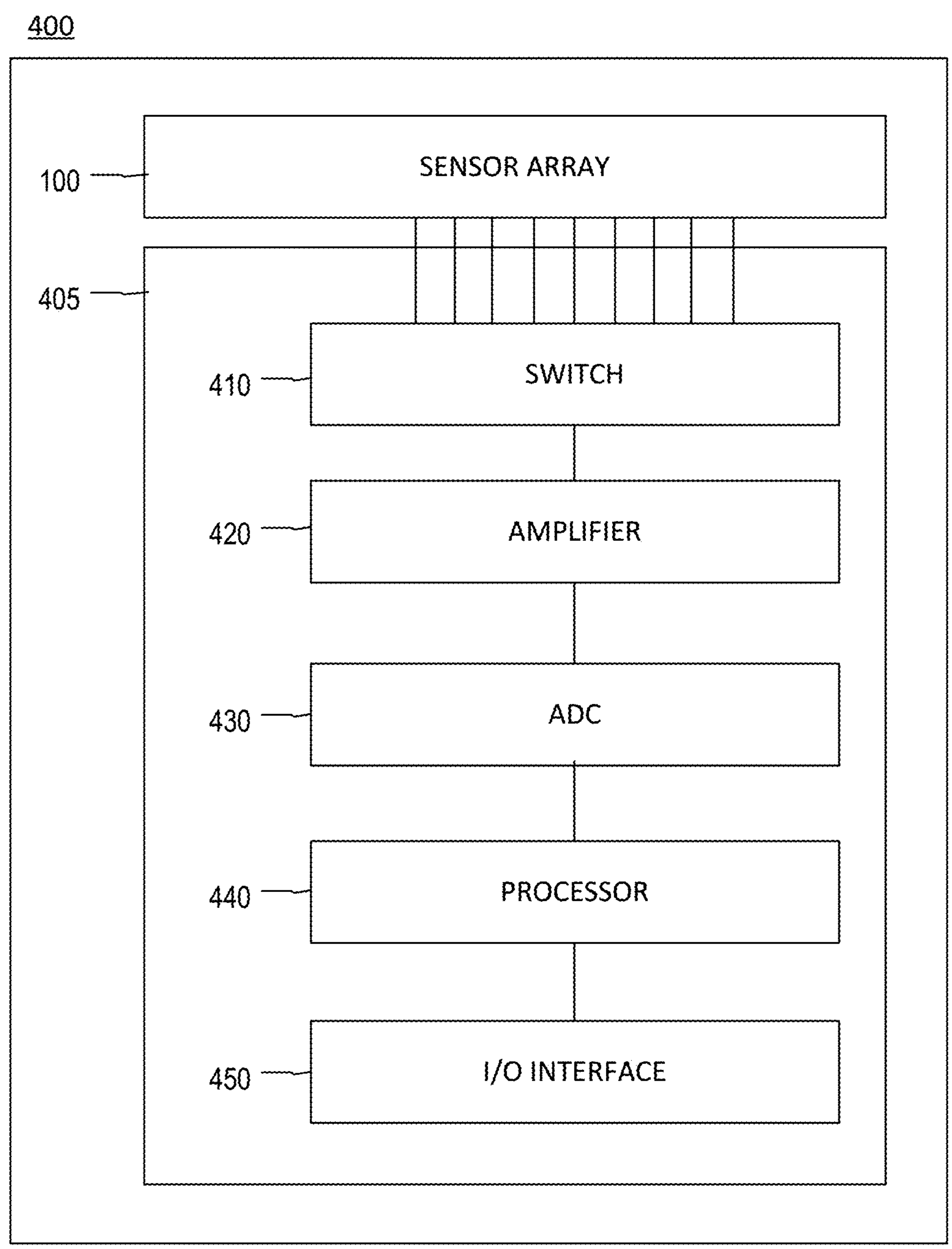
FIG. 4 is a diagram of an example of an optoelectronic device that includes the detector array of FIG. 1A, according to aspects of the disclosure.

FIG. 4 is a diagram of an example of an optoelectronic device 400, according to aspects of the disclosure. As illustrated, the optoelectronic device 400 includes the detector array 100 and a signal processor 405. The detector array 100 and the signal processor 405 may be integrated on the same die or they may be formed on separate dies. The signal processor may include any suitable type of processing circuitry. In some implementations, the signal processor 405 may include one or more of a switch 410, an amplifier 420, an analog-to-digital converter (ADC) 430, a processor 440, and an input/output (I/O) interface 450.

The switch 410 may include any suitable type of electronic device that is configured to receive a plurality of signals from the photodiodes 112*a-i* and feed the signals, one at a time, to the amplifier 420. The amplifier 420 may include any suitable type of device that is configured to increase the power of the signals generated by the photodiodes 112*a-i*. The ADC 430 may include any suitable type of device that is configured to generate a digital representation of an analog signal that is input into the ADC 430. The ADC 430 may include a 16-bit ADC, a 32-bit ADC, a 64-bit ADC, etc. The processor 440 may include any suitable type of electronic circuitry that is capable of performing one or more arithmetic or logic operations based on values generated by the ADC 430. The I/O interface 450 may include any suitable type of parallel or serial interface, such as a Universal Serial Bus (USB) interface or an $I^2C$ interface, etc.

In operation, the photodiodes 112*a-b* may generate a plurality of signals representing the power of different portions of the spectrum of light that is incident on the detector array 100. The switch 410 may switch the signals, such that each of the signals generated by the photodiodes 112*a-i* is supplied to the amplifier 420. The amplifier 420 may amplify each of the signals and feed it to the ADC 430. The ADC 430 may produce a digital representation of each of the signals and supply the digital representation to the processor 440. Based on the respective digital representations of the signals generated by the photodiodes 112*a-i*, the processor 440 may detect a characteristic of light, such as correlated color temperature (CCT) or color. Although in the present example the optoelectronic device includes the processor 440, alternative implementations are possible in which the processor 440 is omitted. In such instances, the digital representations of the signals generated by the photodiodes 112*a-i* may be output from the I/O interface for use by external processing circuitry.

Although in the example of FIG. 4, the amplifier 420 is a 1-channel amplifier, alternative implementations are possible in which the amplifier includes multiple channels. Moreover, in instances in which the amplifier 420 includes multiple channels, the switch 410 may be configured to provide multiple signals to the amplifier 420 in parallel. For example, in instances in which the sensor array 100 includes 32 detector cells, the amplifier 420 may be an 8-channel amplifier and the switch 410 may be configured to feed in parallel signals from 8 different detector cells to the amplifier. As a result, the processor 440 (and/or I/O interface 450) may receive all signals that are generated by the sensor array 100 in as little as 4 clock cycles.

Figure 5:
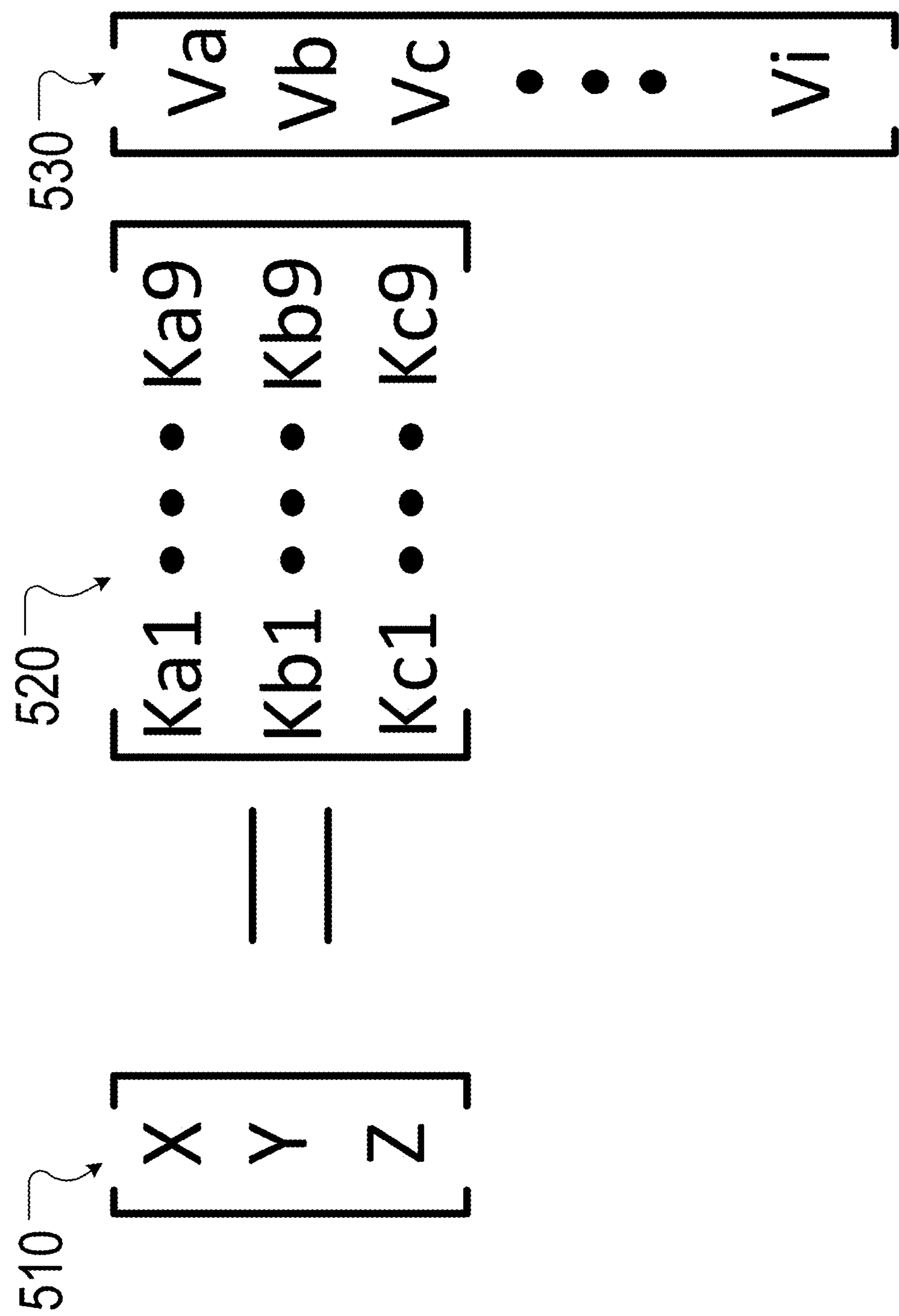
FIG. 5 is a diagram illustrating an example of an operation that is performed by a processor of the optoelectronic device of FIG. 4, according to aspects of the disclosure.

FIG. 5 depicts an example of a mathematical operation, which the processor 440 may be configured to perform, according to aspects of the disclosure. In this example, the processor 440 may be configured to generate a vector 510 which identifies the color of light applied to the detector array 100 in the CIE 1931 color space. As such, the vector 510 may include tristimulus values X, Y, Z which provide an objective description of color sensation registered in the human eye. Although in the present example the processor 440 generates a representation of light in the CIE 1394 color space, alternative implementations are possible in which another type of representation is created, such as a representation in the RGB color space or a representation in the YCrCb color space.

As illustrated, the vector 510 may be calculated by multiplying a vector 530 by a coefficient matrix 520. The vector 530 may include the values Va-Vi which represent the values of the signals generated by different photodiodes in the detector array 100. For example, value Va may represent the magnitude of the signal generated by the photodiode 112*a*; value Vb may represent the magnitude of the signal generated by the photodiode 112*b*; value Vc may represent the magnitude of the signal generated by the photodiode 112*c*; value Vd may represent the magnitude of the signal generated by the photodiode 112*d*; value Ve may represent the magnitude of the signal generated by the photodiode 112*e*; value Vf may represent the magnitude of the signal generated by the photodiode 112*f*; value Vg may represent the magnitude of the signal generated by the photodiode 112*g*; value Vh may represent the magnitude of the signal generated by the photodiode 112*h*; and value Vi may represent the magnitude of the signal generated by the photodiode 112*i*.

In some implementations, the coefficient matrix 520 may be a matrix that is pre-stored in a memory (not shown) of the processor 440. The coefficient matrix may be calculated by calibrating the optoelectronic device 400 with a known or standard reference light source. The calibration may be performed by exposing the optoelectronic device 400 to a calibration light whose color is known, and solving the equation shown in FIG. 5 for the coefficient matrix 520.

Figure 7:
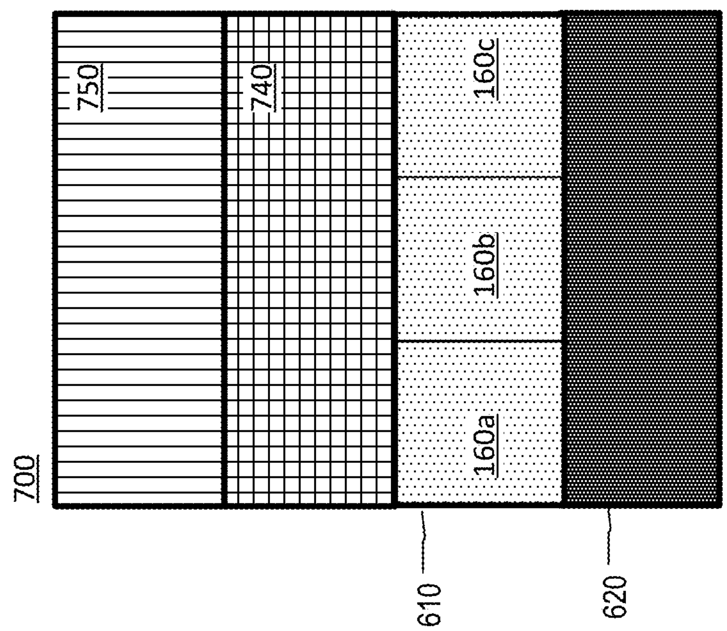
FIG. 7 is a diagram of yet another example of a detector array, according to aspects of the disclosure.
Figure 6:
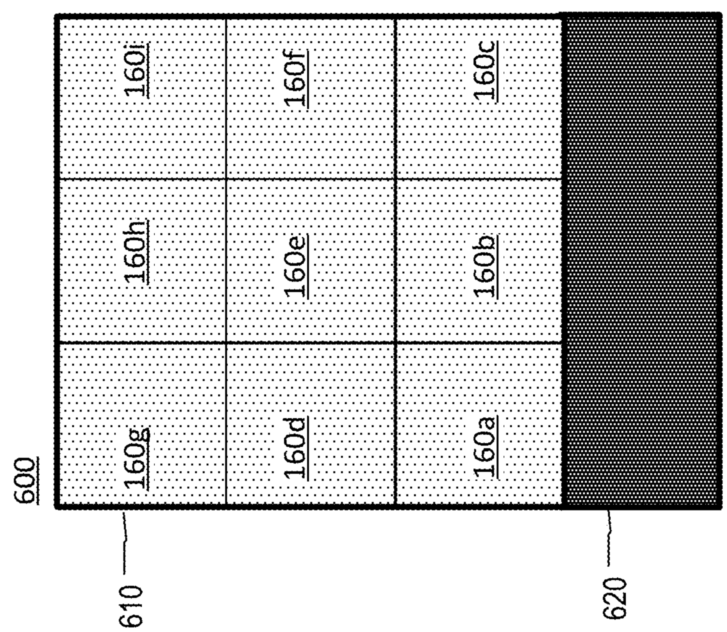
FIG. 6 is a diagram of another example of a detector array, according to aspects of the disclosure.

FIG. 6 is a schematic diagram of an example of optoelectronic device 600, according to aspects of the disclosure. The optoelectronic device includes a detector array 610 and a signal processor 620. The detector array 610 may include detector cells 160*a-i*, as shown. The detector array 610 may be the same or similar to the detector array 100, except for the sensors cells 160*a-i* being arranged in a grid. The signal processor 620 may be the same or similar to the signal processor 405, which is discussed above with respect to FIG. 4. FIG. 7 is a schematic diagram of an example of an optoelectronic device 700, according to aspects for the disclosure. The optoelectronic device 700 may be the same or similar to the optoelectronic device 600, but for including an IR-cutoff filter 740 and an IR-pass filter 750, as shown. The IR-cutoff filter 740 may be disposed over cells 160*d*, 160*e*, and 160*f* of the detector array 610 and it may be the same or similar to the IR-cutoff filter 140. The IR-pass filter 750 may be disposed over cells 160*g*, 160*h*, and 160*i* of the detector array 610 and it may be the same or similar to the IR-pass filter 150.

Figure 8:
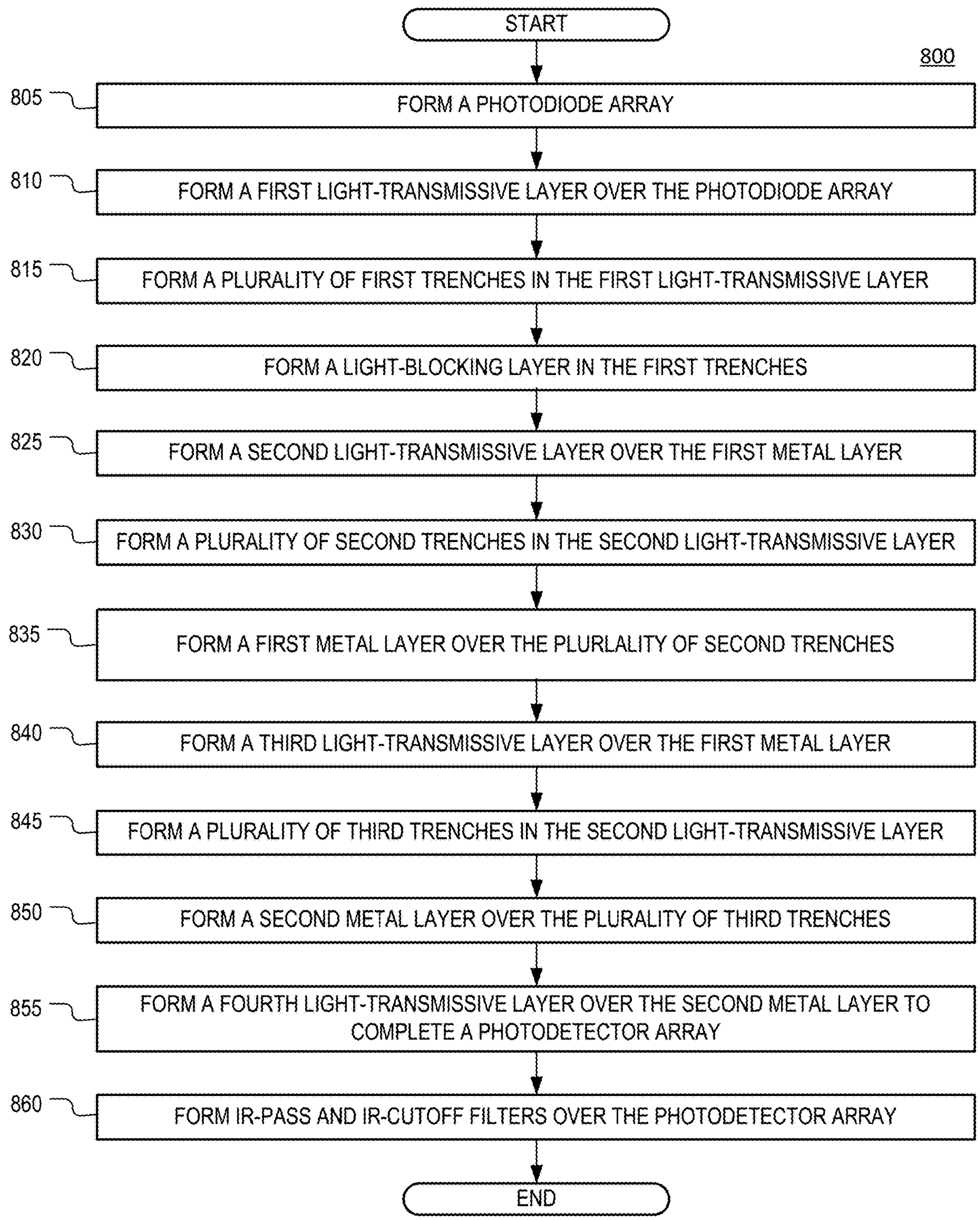
FIG. 8 is a flowchart of an example of a process for manufacturing a detector array, according to aspects of the disclosure.

FIG. 8 is a flowchart of an example of a process 800 for manufacturing a detector array, according to aspects of the disclosure.

At step 805, a photodiode array 910 is formed. An example of the photodiode array 910 is shown in FIGS. 9A-C. As illustrated, the photodiode array may include photodiodes 912*a-i* formed on a p-substrate 940. In some implementations, the photodiodes 912*a-c* may be the same or similar to the photodiodes 112*a-c*, which are discussed above with respect to FIGS. 1A-B. Additionally or alternatively, the photodiodes 912*d-i* may be the same or similar to the photodiodes 112*d-i*, which are discussed above with respect to FIG. 1.

The photodiodes 912*a-c* may be p+/n-well diodes and they may be used to detect the power of light emissions in the UV band. Each of the photodiodes 912*a-c* may include a respective p+ region 914 that is surrounded on sides and bottom by an n-well region 917*a*, and a p-region 918 that is disposed under the n-well region 917*a*. The p+ regions 914 may be the same or similar to the p+ regions 114, the n-well region 917*a* may be the same or similar to the n-well region 117*a*, and the p-region 918 may be the same or similar to the p-region 118. The photodiodes 912*d-i* may include n+/P-epi photodiodes and they may be used to detect light in the IR and visible light bands. Each of the photodiodes 912*d-i* may include a respective n+ region 915 that is surrounded on the sides by the n-well region 917*b*, and a p-region 919 disposed under the n-well region 917*b* and the n+ regions 915. The n+ regions 915 may be the same or similar the n+ regions 115, the n-well region(s) 917*b* may be the same or similar as the n-well region 117*b*, and the p-region 919 may be the same or similar to the p-region 119.

Figure 10B:
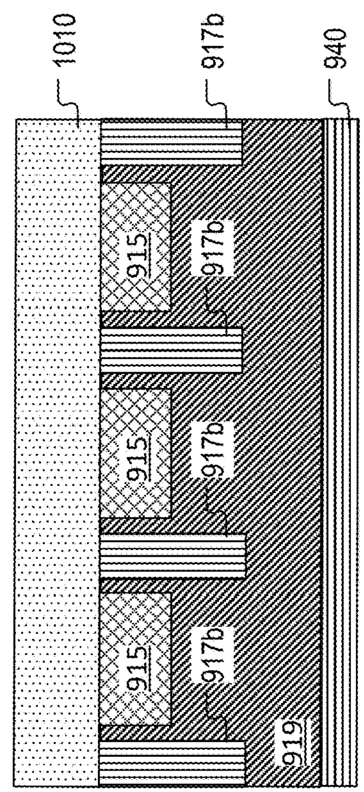
FIG. 10B is a cross-sectional side view of the assembly of FIG. 10A, according to aspects of the disclosure.
Figure 10A:
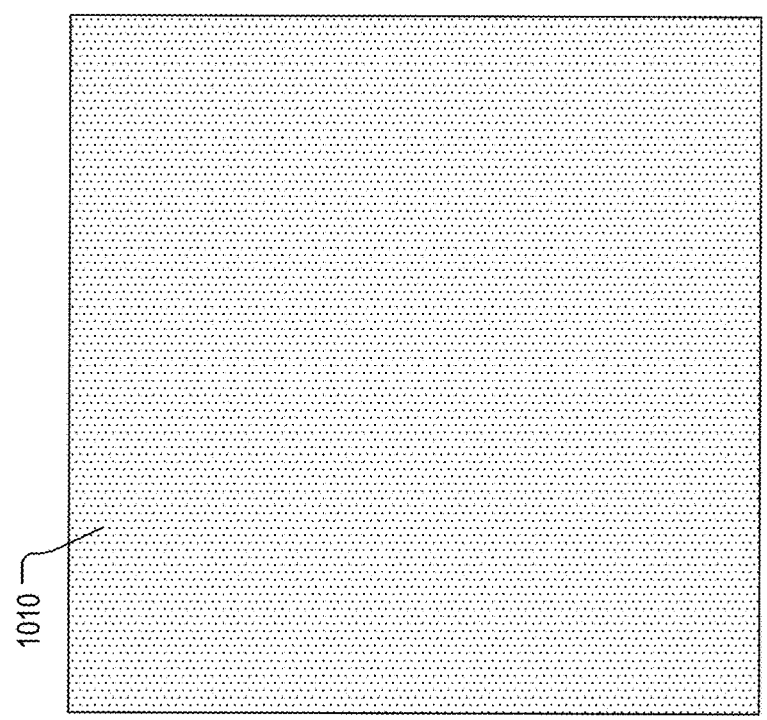
FIG. 10A is a top-down view of an example of an assembly including a first light-transmissive layer that is formed as a result of executing a second step of the process of FIG. 8, according to aspects of the disclosure.

At step 810, a layer of dielectric light-transmissive material 1010 is formed over the photodiode array 910. An example of the light-transmissive layer 1010 is shown in FIGS. 10A-B. As illustrated, the layer of light-transmissive material may be formed of any suitable type of material, such as silicon dioxide including Borophosphosilicate glass (BPSG), phosphosilicate glass (PSG), undoped silica glass (USG) and fluorosilicate glass (FSG) glass materials, etc. In some implementations, the layer of light-transmissive material 1010 may be formed using plasma-enhanced chemical vapor deposition (PECVD) and/or any other suitable type of process. In some implementations, the layer of light-transmissive material 1010 may be separated from the photodiode array 910 by a passivation layer (not shown). The passivation layer may be formed of silicon dioxide $SiO_2$ and Silicon Nitride $Si_3N_4$. In some implementations, the layer of light-transmissive 1010 material may have a thickness in the range of 5 um-7.5 um.

Figure 11B:
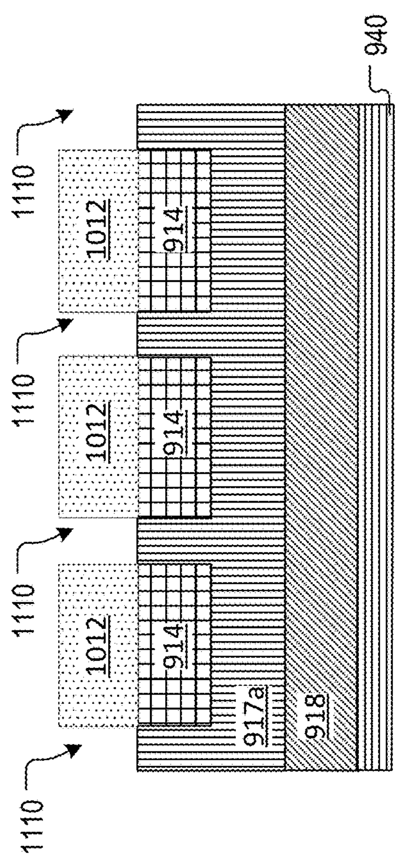
FIG. 11B is a first cross-sectional side view of the assembly of FIG. 11A, according to aspects of the disclosure.
Figure 11C:
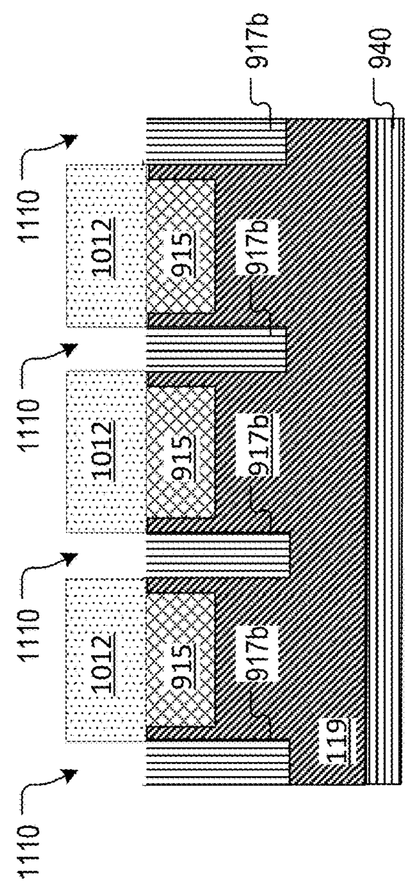
FIG. 11C is a second cross-sectional side view of the assembly of FIG. 11A, according to aspects of the disclosure.
Figure 11A:
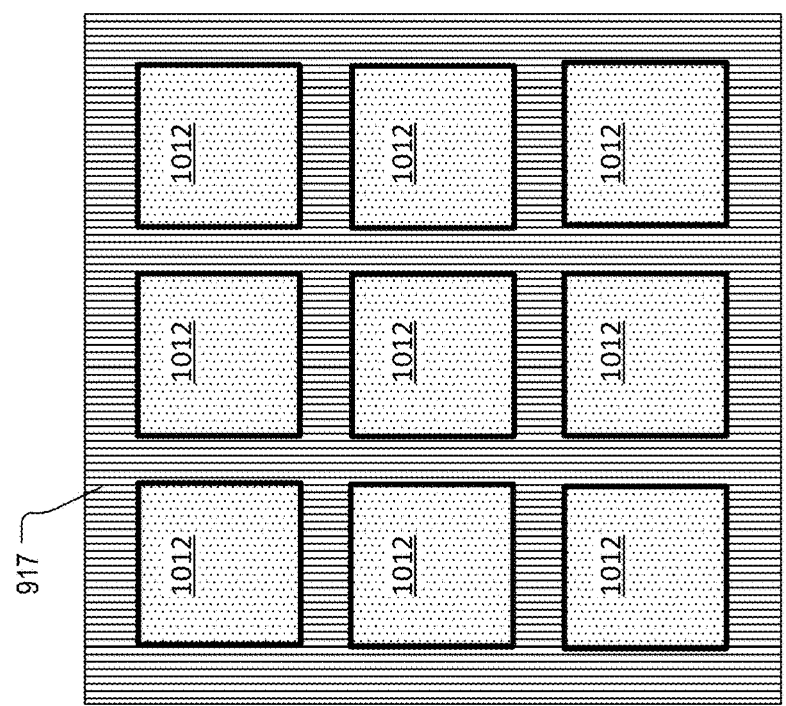
FIG. 11A is a top-down view of an example of an assembly that includes a plurality of first trenches formed in the first light-transmissive layer of FIG. 10A as a result of executing a third step in the process of FIG. 8, according to aspects of the disclosure.

At step 815, a plurality of trenches 1110 are formed into the layer of light-transmissive material 1010 to define a plurality of guide members 1012. The guide members 1012 may be the same or similar to the guide members 124*a-i*. An example of the trenches 1110 is shown in FIGS. 11A-C. As illustrated, in some implementations, the trenches 1110 may be formed above at least a portion of the n-well regions 917*b*. Additionally or alternatively, in some implementations, the trenches 1110 may be formed above portions of the n-well region 917*a* that are situated between adjacent p+ regions 914. Additionally or alternatively, in some implementations, the trenches 1110 may be formed above portions of the n-well region 917*b* that are situated between adjacent n+ regions 915. The trenches 1110 may be formed using CMOS or BICMOS back end of line process and/or any other suitable type of process. The trenches 1110 may have a depth that is less than, greater than, or equal to the thickness of the light-transmissive layer 1010.

Figure 12A:
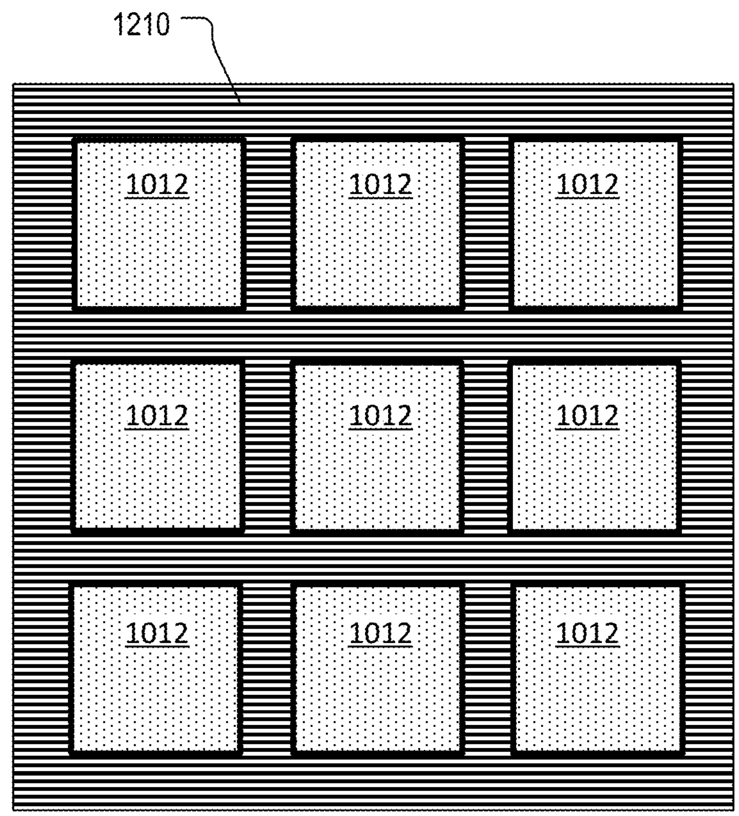
FIG. 12A is a top-down view of an assembly that includes a light-blocking layer that is formed in the plurality of trenches of FIG. 11A as a result of executing a fourth step in the process of FIG. 8, according to aspects of the disclosure.
Figure 12B:
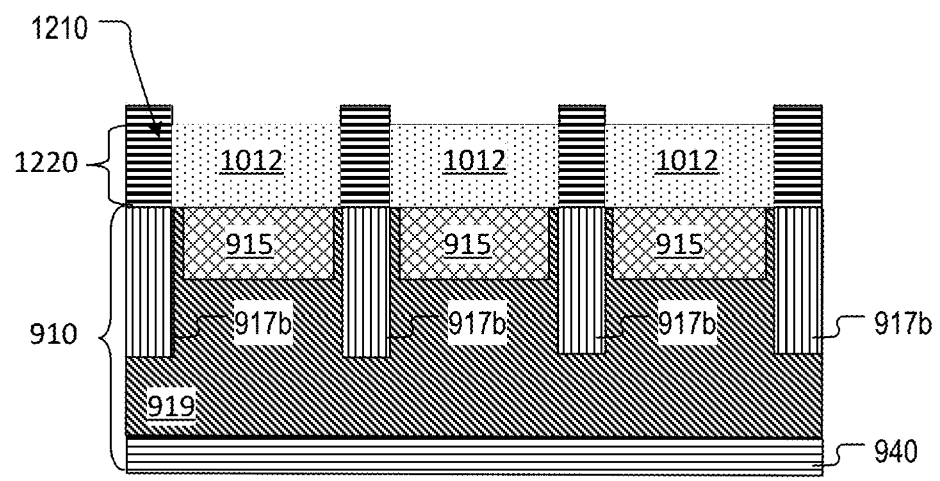
FIG. 12B is a cross-sectional side view of the assembly of FIG. 12A, according to aspects of the disclosure.

At step 820, a light-blocking layer 1210 is formed in the trenches 1110 to complete a guide array 1120. An example of the light-blocking layer 1210 and the guide array 1220 is shown in FIGS. 12A-B. The guide array 1220 may include the guide members 1012 and the light-blocking layer 1210, as shown. The guide array 1220 may be the same or similar to the guide array 120, which is discussed above with respect to FIGS. 1A-B. The light-blocking layer 1210 may be the same or similar to the light-blocking layer 122, which is discussed above with respect to FIGS. 1A-C. In some implementations, the light-blocking layer 1210 may have thickness in the range of 4.5 um to 5.5 um for a 3 metal layer process. In some implementations, the light-blocking layer 1210 may have a greater thickness than the layer of light-transmissive material 1010, such that the top surface of the light-blocking layer 1210 is situated above the top surface of the layer of light-transmissive material 1310.

Figure 13A:
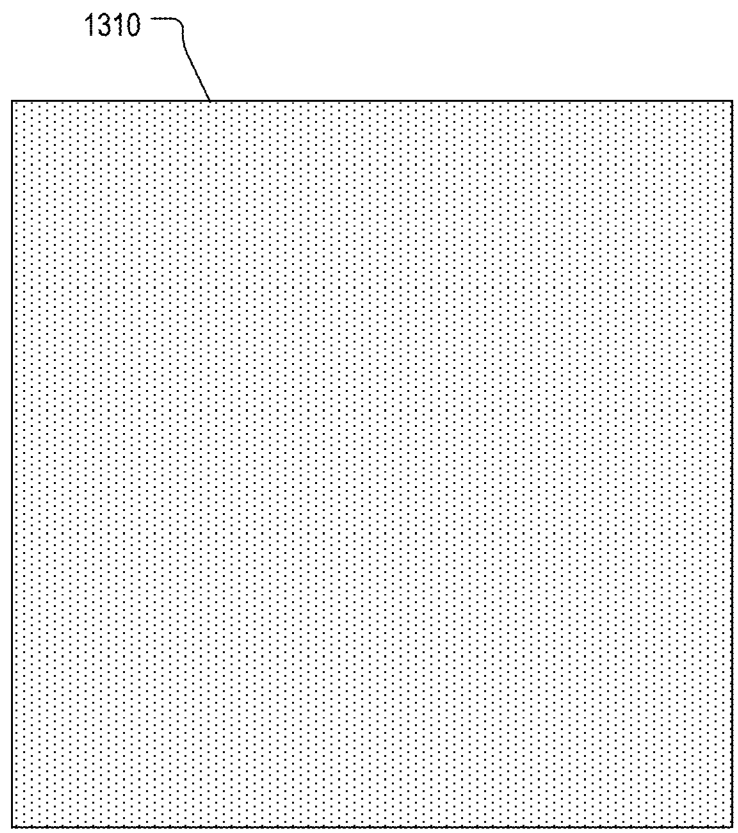
FIG. 13A is a top-down view of an assembly that includes a layer of light-transmissive material formed over the assembly of FIG. 12A as a result of executing a fifth step in the process of FIG. 8, according to aspects of the disclosure.
Figure 13B:
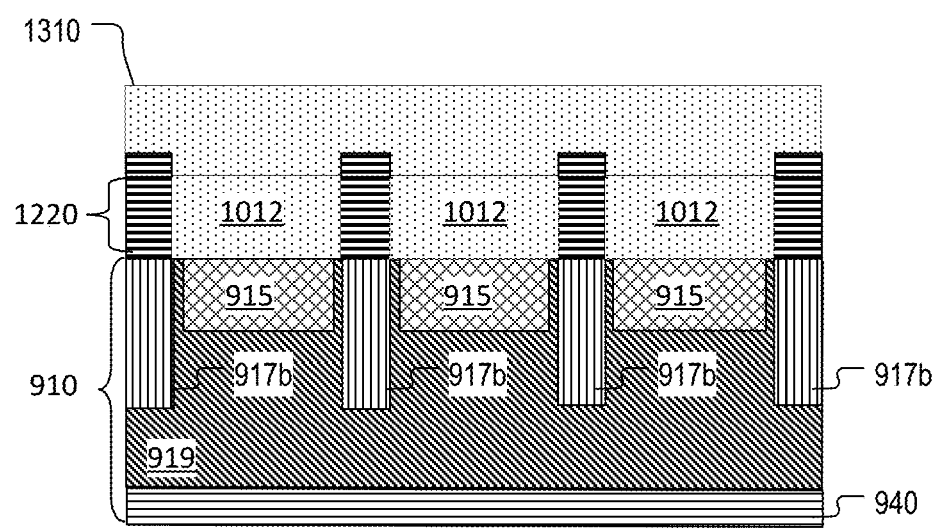
FIG. 13B is a cross-sectional side view of the assembly of FIG. 13A, according to aspects of the disclosure.

At step 825, a layer of dielectric light-transmissive material 1310 is formed over the photodiode array. An example of the layer of light-transmissive material 1310 is shown in FIGS. 13A-B. The layer of light-transmissive material 1310 may be formed using any suitable type of material, such as a $Si_3N_4$ material, $Al_2O_3$, $HfO_2$, $SiO_2$, $TiO_2$, $Nb_2O_5$. In some implementations, low pressure chemical vapor deposition (LPCVD) and atomic layer deposition (ALD) may be used to form the layer 1310.

Figure 14A:
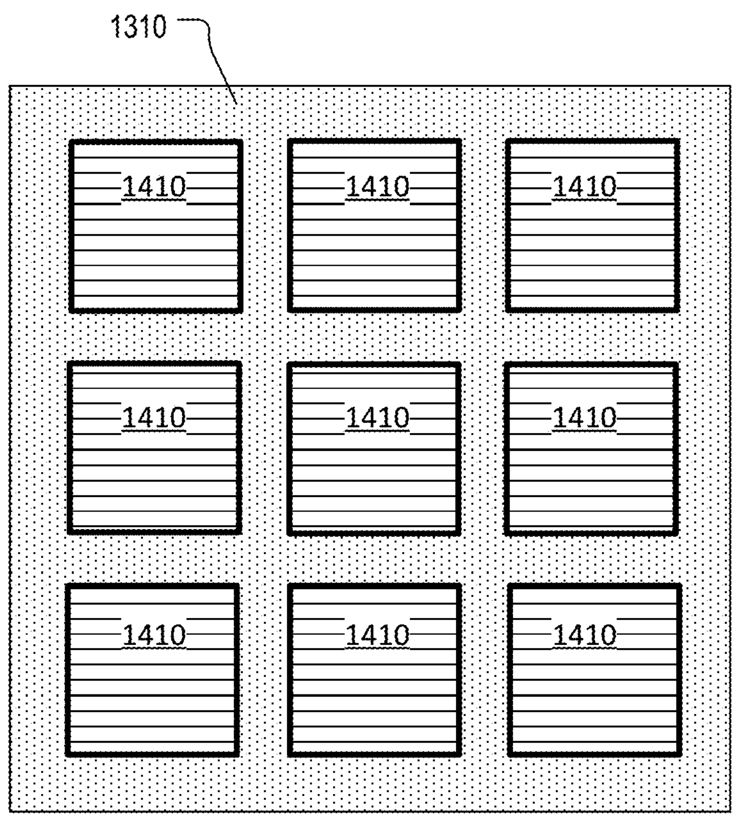
FIG. 14A is a top-down view of an assembly that includes a plurality of trenches formed in the assembly of FIG. 13A as a result of executing a sixth step in the process of FIG. 8, according to aspects of the disclosure.
Figure 14B:
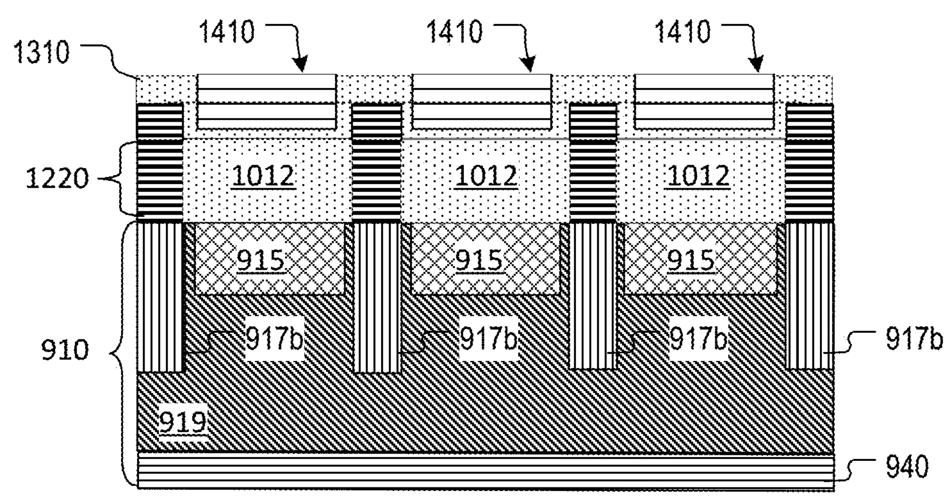
FIG. 14B is a cross-sectional side view of the assembly of FIG. 14A, according to aspects of the disclosure.

At step 830, a plurality of trenches 1410 is formed into the layer of light-transmissive material 1310. An example of the trenches 1410 is shown in FIGS. 14A-B. As illustrated, in some implementations, the trenches 1410 may have substantially the same depth and each of the trenches 1410 may be formed above a different one of the photodiodes 912*a-i*. In some implementations, each of the trenches 1410 may extend below the level of the top surface of the light-blocking layer 1210, as shown. The level of the top surface of the light-blocking layer 1210 is denoted by a dashed line in FIGS. 14A-B. In some implementations, the trenches 1410 may be formed using low temperature plasma etching or atomic layer precision etching (ALE) systems and/or any other suitable type of process.

At step 835, a metal layer 1510 is formed over the layer of light-transmissive material 1310. An example of the metal layer 1510 is shown in FIGS. 15A-B. The metal layer 1510 may be formed of any suitable material, such as silver, aluminum, gold or copper etc. In some implementations, the metal layer may be formed using an alloy including aluminum (Al) and silver (Ag). The metal layer 1510 may be formed using any suitable type of process, such as thermal evaporation, electron gun deposition with ion assist deposition, and sputter deposition for example. In some implementations, portions of the metal layer 1510 that are formed on the bottom of the trenches 1410 may be at least partially situated below the level of the top surface of the light-blocking layer 1210. The level of the top surface of the light-blocking layer 1210 is denoted by a dashed line in FIGS. 15A-B.

Figure 16A:
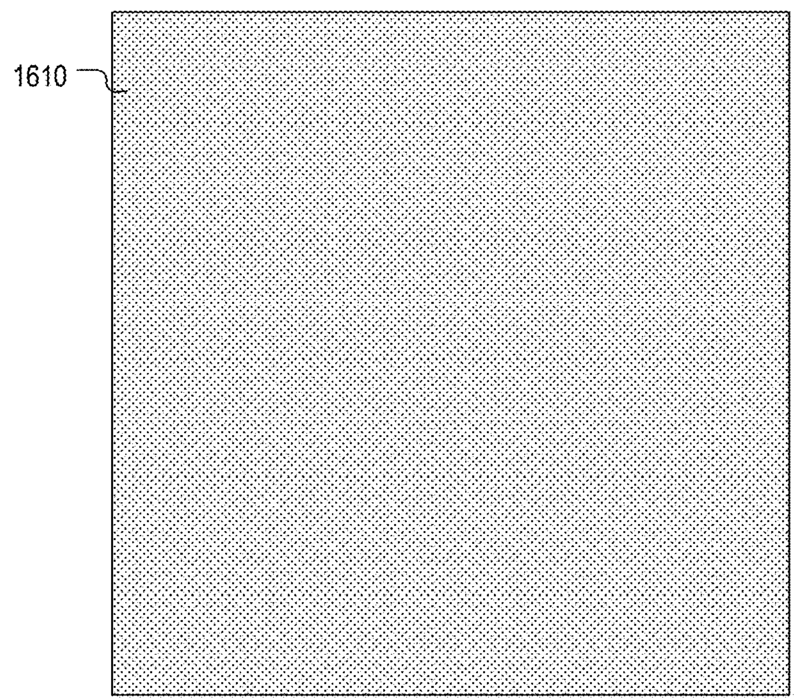
FIG. 16A is a top-down view of an assembly that includes a second light-transmissive layer formed over the assembly of FIG. 15A as a result of executing an eight step of the process of FIG. 8, according to aspects of the disclosure.
Figure 16B:
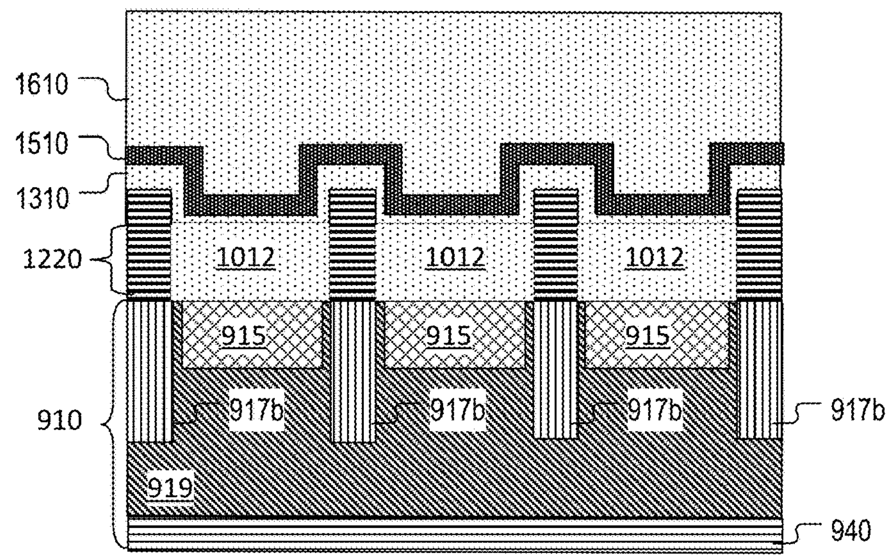
FIG. 16B is a cross-sectional side view of the assembly of FIG. 16A, according to aspects of the disclosure.

At step 840, a layer of dielectric light-transmissive material 1610 is formed over the metal layer 1510. An example, of the layer of light-transmissive material 1610 is shown in FIGS. 16A-B. The layer of light-transmissive material 1610 may be formed using any suitable type of material, such as a Si3N4 material, $Al_2O_3$, $HfO_2$, $SiO_2$, $TiO_2$, $Nb_2O_5$. In some implementations, low pressure chemical vapor deposition (LPCVD) and atomic layer deposition (ALD) may be used to form the layer 1610. In some implementations, the layer of light-transmissive material 1610 may have a thickness in the range of 1200 A to 2500 A.

Figure 17A:
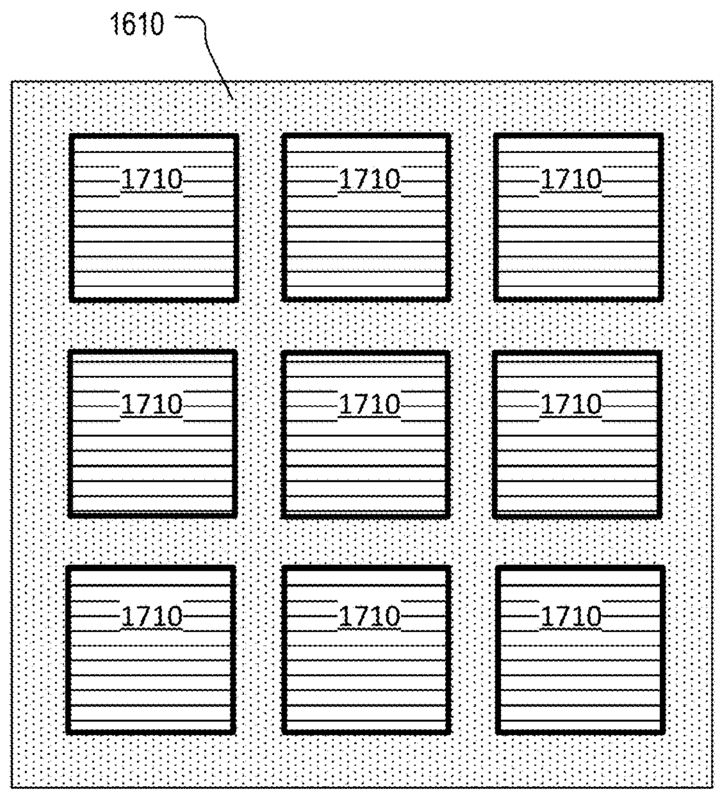
FIG. 17A is a top-down view of an assembly that includes a plurality of trenches formed in the assembly of FIG. 16A as a result of executing a ninth step in the process of FIG. 8, according to aspects of the disclosure.
Figure 17B:
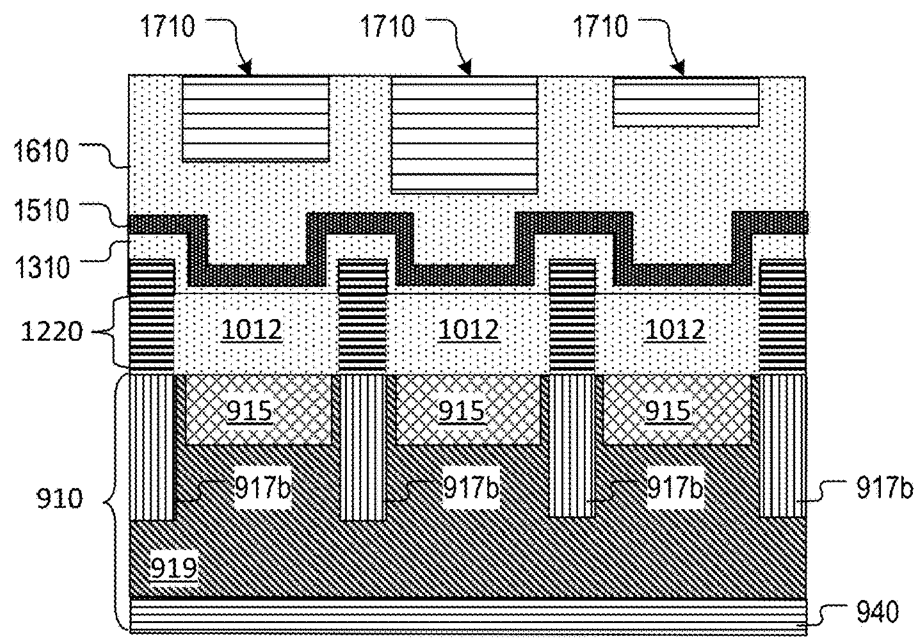
FIG. 17B is a cross-sectional side view of the assembly of FIG. 17A, according to aspects of the disclosure.

At step 845, a plurality of trenches 1710 is formed into the layer of light-transmissive material 1610. An example of the trenches 1710 is shown in FIGS. 17A-B. In some implementations, at least one of the trenches 1710 may have a different depth than at least one other trench 1710. Additionally or alternatively, in some implementations, each of the trenches 1710 may have a different depth than the rest. Additionally or alternatively, in some implementations, each of the trenches 1710 may be formed over a different one of the photodiodes 912*a-i* in the photodiode array 910, as shown. In some implementations, the trenches 1710 may be formed using low temperature plasma etching or atomic layer precision etching (ALE) systems and/or any other suitable type of process.

Figure 18A:
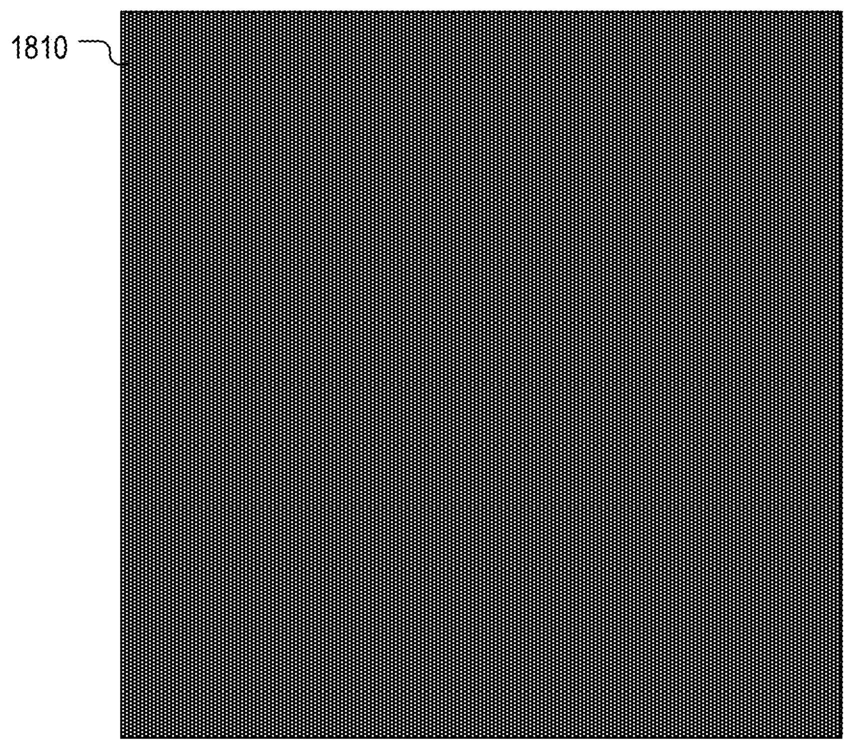
FIG. 18A is a top-down view of an assembly that includes a second metal layer that is formed over the assembly of FIG. 17A as a result of executing a tenth step of the process of FIG. 8, according to aspects of the disclosure.
Figure 18B:
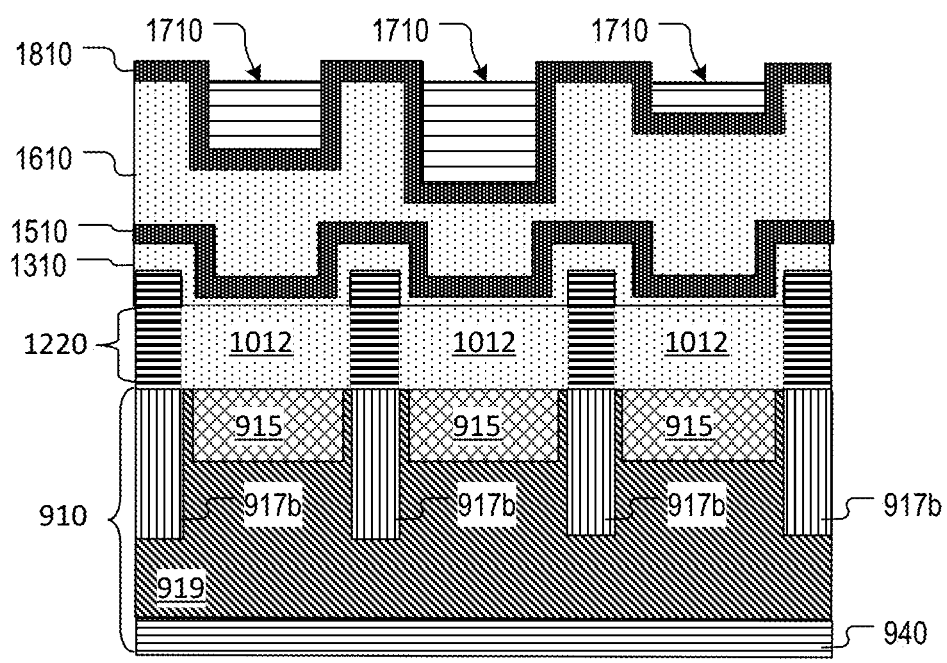
FIG. 18B is a cross-sectional side view of the assembly of FIG. 18A, according to aspects of the disclosure.

At step 850, a metal layer 1810 is formed over the light-transmissive layer 1610 and the trenches 1710, as shown. An example of the metal layer 1810 is shown in FIGS. 18A-B. In some implementations, the metal layer 1810 may be formed of an alloy including aluminum (Al) and silver (Ag). In some implementations, the metal layer 1810 may be formed using silver, aluminum, gold, copper and/or any other suitable type of material. The metal layer 1510 may be formed using any suitable type of process, such as thermal evaporation, electron gun deposition with ion assist deposition, and sputter deposition for example. In some implementations, the layer 1810 may have a thickness in the range of 400 A to 600 A depending on the bandwidth requirement of the band pass filter design.

Figure 19A:
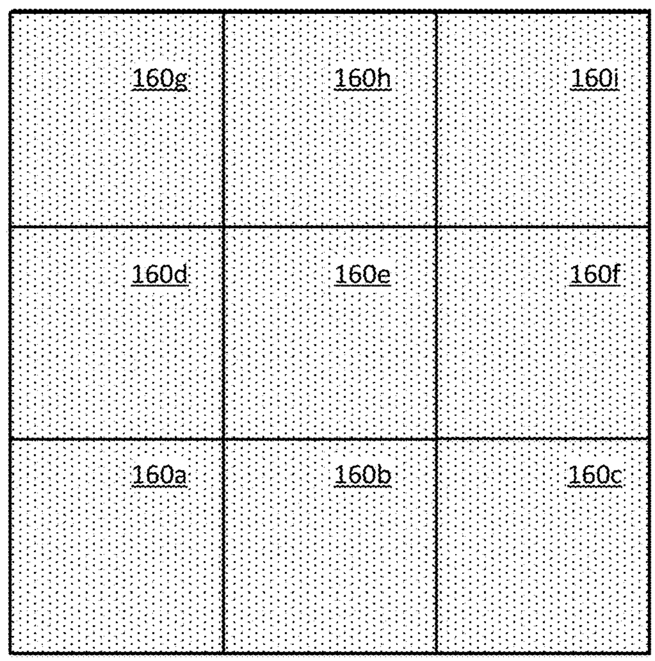
FIG. 19A is a top-down view of an assembly that is formed as a result of executing an eleventh step of the process of FIG. 8, according to aspects of the disclosure.
Figure 19B:
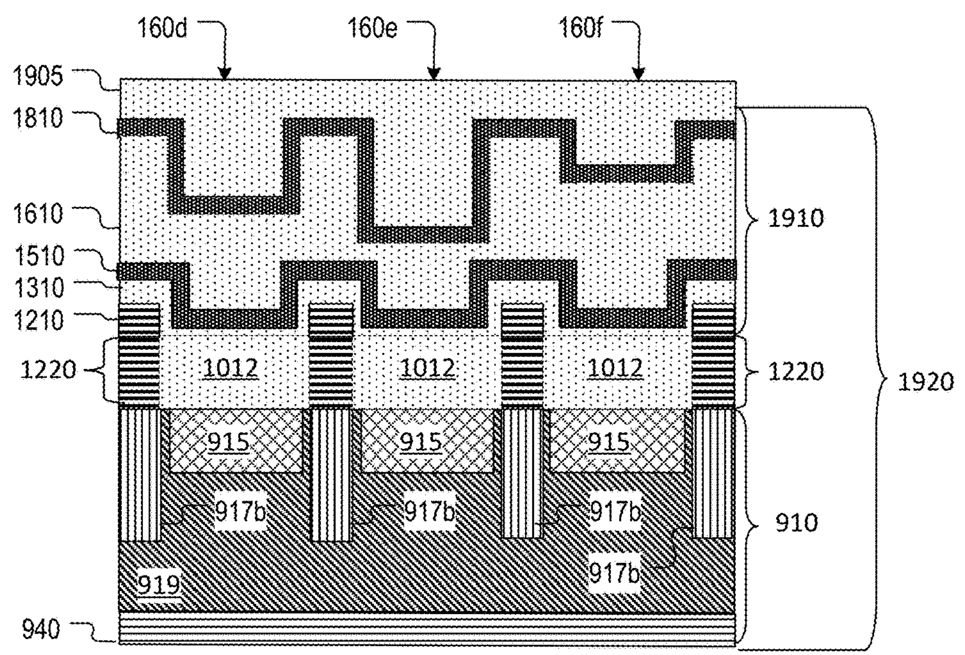
FIG. 19B is a cross-sectional side view of the assembly of FIG. 19A, according to aspects of the disclosure.

At step 855, a layer of light-transmissive material 1905 is formed over the metal layer 1810 to complete a filter array 1910. An example of the filter array 1910 is shown in FIGS. 19A-B. In some implementations, the layer of light-transmissive material 1905 may be formed using any suitable type of material, such as a $Si_3N_4$ material, $Al_2O_3$, $HfO_2$, $SiO_2$, $TiO_2$, $Nb_2O_5$. In some implementations, low pressure chemical vapor deposition (LPCVD) and atomic layer deposition (ALD) may be used to form the layer 1905. Apart for using continuous metal layers to form different Fabry-Perot cavities, the filter array 1910 may be the same or similar to the filter array 130, which is discussed above with respect to FIGS. 1A-B.

FIGS. 19A-B show an example of a resultant detector array 1920 that is produced as a result of performing steps 805-855 of the process 800. As illustrated, the detector array 1920 may include plurality of detector cells 160*a-i*. As the numbering suggests, the detector cells in the detector array 1920 may be similar to the detector cells in the detector array 100 and the detector cells in the detector array 610, which are discussed above with respect to FIGS. 1A-B and 6. As noted above, in some implementations, the detector cells 160*a-c* may be arranged to measure the energy of light emissions in the UV band, the cells 160*d-f* may be arranged to measure the energy of light emissions in the visible light band, and the cells 160*g-i* may be arranged to measure the energy of light in the IR band.

Figure 20A:
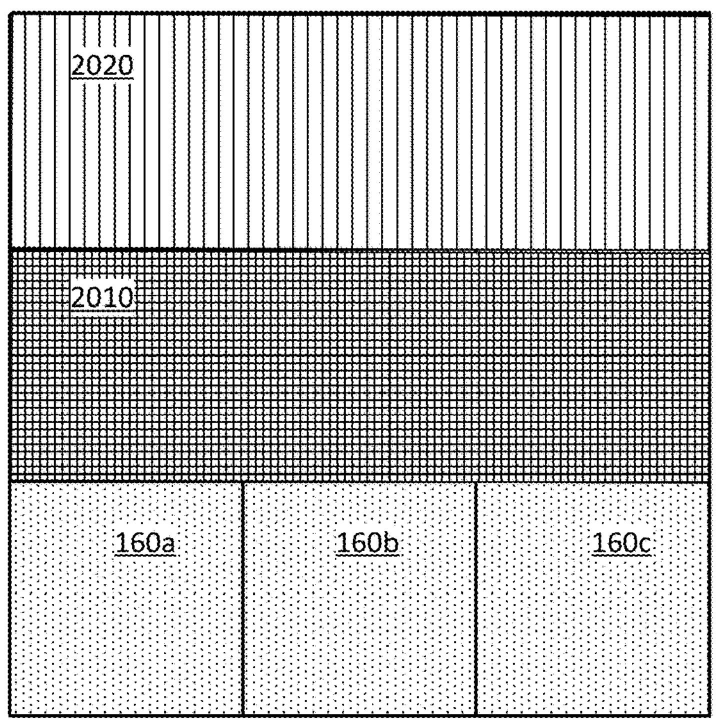
FIG. 20A is a top-down view of a detector array that is completed as a result of executing a twelfth step in the process of FIG. 8, according to aspects of the disclosure.
Figure 20B:
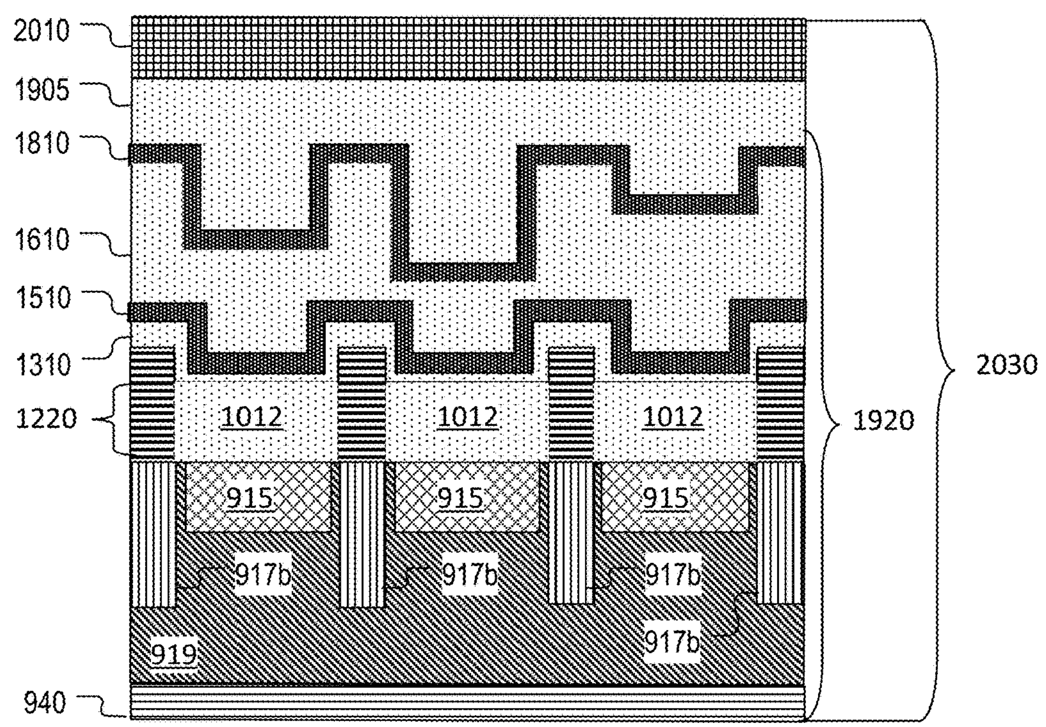
FIG. 20B is a cross-sectional side view of the detector array of FIG. 20A, according to aspects of the disclosure.

At step 860, an IR-cutoff filter 2010 is formed over the detector cells 160*d-f* of the detector array 1720 and an IR-pass filter 2020 is formed over the detector cells 160*g-i* of the detector array 1920 to complete an optoelectronic device 2030. In some implementations, the IR-cutoff filter 2010 may be the same or similar to the IR-cutoff filter 140. Additionally or alternatively, in some implementations, the IR-cutoff filter 2010 may be the same or similar to the IR-pass filter 150. An example of the filters 2010 and 2020 is shown in FIGS. 20A-B.

FIGS. 1-20B are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples. By way of example, in some implementations, the term "light-transmissive material" may refer to any material having a light transmissivity greater than 80% to 95%. By way of example, in some implementations, that the term "light-blocking material" may refer to any material having a light transmissivity less than 2% to 0.1%. It will be further understood that the values for the thicknesses of various elements of the disclosed device(s) are provided as an example only, and the disclosure is not limited in any way to those values. It will be further understood that the materials and processes used to form various components of the disclosed device(s) are provided as an example only, and the disclosure is not limited in any way to those materials and/or processes.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is claimed is:

1. An optoelectronic device, comprising:

a photodiode array including a plurality of first photodiodes, each first photodiode including a respective n+ region and a respective n-well region, each n-well region having an upper surface;

a guide array disposed over the photodiode array, the guide array including a plurality of guide members separated from one another by a layer of light-blocking material, the plurality of guide members being disposed over the n+ regions of the plurality of first photodiodes, such that each guide member is disposed over a different respective n+ region, and the layer of light-blocking material being disposed over and substantially covering an entirety of the upper surfaces of the n-well regions of the plurality of first photodiodes; and a filter array disposed over the guide array, the filter array including a plurality of bandpass filters, each bandpass filter being aligned with a different one of the plurality of guide members, each bandpass filter having a different transmission band.

2. The optoelectronic device of claim 1, wherein the layer of light-blocking material includes at least one of a light-reflecting material or a light-absorbing material.

3. The optoelectronic device of claim 1, wherein each guide member is formed of a light-transmissive material.

4. The optoelectronic device of claim 1, wherein:

the photodiode array includes a plurality of second photodiodes that are different from the plurality of first photodiodes, each of the first photodiodes is disposed underneath a respective bandpass filter that is arranged to transmit light in the visible light band, and each of the second photodiodes being positioned underneath a respective bandpass filter that is arranged to transmit light in the ultraviolet light band.

5. The optoelectronic device of claim 1, further comprising:

an infrared-pass (IR-pass) filter disposed over at least one of the bandpass filters that has a transmission band in the IR band; and an IR-cutoff filter disposed over at least one of the bandpass filters that has a transmission band outside of the IR band.

6. The optoelectronic device of claim 1, wherein the filter array includes a continuous or segmented first metal layer formed over the guide array, and a continuous or segmented second metal layer formed over the first metal layer, the second metal layer including a plurality of portions, such that each portion of the second metal layer is spaced apart from the first metal layer by a different distance.

7. The optoelectronic device of claim 6, wherein:

the layer of light-blocking material has a first thickness that is greater than a second thickness of a given one of the guide members, and at least one bandpass filter in the filter array includes a respective first metal portion and a respective second portion that is spaced apart from the first metal portion, the respective first metal portion being disposed over the given one of the guide members in the guide array, such that at least some of the respective first metal portion is situated below a level of a top surface of the layer of light-blocking material.

8. The optoelectronic device of claim 1, further comprising:

an input-output (I/O) interface; and a processor configured to:

receive a plurality of signals, each of the signals being generated by a different one of the first photodiodes;

generate, based on the plurality of signals, an indication of a color of light that is incident on the photodiode array; and output the indication of the color of light via the I/O interface.

9. An optoelectronic device comprising:

a photodiode array including a plurality of first photodiodes, each first photodiode including a respective n+ region and a respective n-well region, each n-well region having an upper surface;

a guide array disposed over the photodiode array, the guide array including a plurality of guide members separated from one another by a layer of light-blocking material, each guide member being disposed over a different one of the plurality of first photodiodes, and the layer of light-blocking material being disposed over and substantially covering an entirety of the upper surfaces of the n-well regions of the plurality of first photodiodes; and a filter array disposed over the guide array, the filter array including a plurality of bandpass filters, each bandpass filter being disposed over a different one of the plurality of guide members, and each bandpass filter having a different respective transmission band.

10. The optoelectronic device of claim 9, wherein the layer of light-blocking material includes at least one of a light-reflecting material or a light-absorbing material.

11. The optoelectronic device of claim 9, wherein each guide member is formed of a light-transmissive material.

12. The optoelectronic device of claim 9, wherein:

the photodiode array includes a plurality of second photodiodes that are different from the plurality of first photodiodes, each of the first photodiodes is disposed underneath a respective bandpass filter that is arranged to transmit light in the visible light band, and each of the second photodiodes being positioned underneath a respective bandpass filter that is arranged to transmit light in the ultraviolet light band.

13. The optoelectronic device of claim 9, further comprising:

an infrared-pass (IR-pass) filter disposed over at least one of the bandpass filters that has a transmission band in the IR band; and an IR-cutoff filter disposed over at least one of the bandpass filters that has a transmission band outside of the IR band.

14. The optoelectronic device of claim 9, wherein the filter array includes a continuous or segmented first metal layer formed over the guide array, and a continuous or segmented second metal layer formed over the first metal layer, the second metal layer including a plurality of portions, such that each portion of the second metal layer is spaced apart from the first metal layer by a different distance.

15. The optoelectronic device of claim 14, wherein:

the layer of light-blocking material has a first thickness that is greater than a second thickness of a given one of the guide members, and at least one bandpass filter in the filter array includes a respective first metal portion and a respective second portion that is spaced apart from the first metal portion, the respective first portion being disposed over the given one of the guide members in the guide array, such that at least some of the respective first metal portion is situated below a level of a top surface of the layer of light-blocking material.

16. The optoelectronic device of claim 1, further comprising:

an input-output (I/O) interface; and a processor configured to:

receive a plurality of signals, each of the signals being generated by a different one of the first photodiodes;

generate, based on the plurality of signals, an indication of a color of light that is incident on the photodiode array; and output the indication of the color of light via the I/O interface.

* * * * *